(12) United States Patent
Akita et al.

(10) Patent No.: US 6,608,514 B1
(45) Date of Patent: Aug. 19, 2003

(54) CLOCK SIGNAL GENERATOR CIRCUIT AND SEMICONDUCTOR INTEGRATED CIRCUIT WITH THE SAME CIRCUIT

(75) Inventors: Hironobu Akita, Yokohama (JP); Katsuaki Isobe, Kawasaki (JP); Masaharu Wada, Yokohama (JP); Kenji Tsuchida, Kawasaki (JP); Haruki Toda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/511,352

(22) Filed: Feb. 23, 2000

(30) Foreign Application Priority Data

Feb. 23, 1999 (JP) .......................... 11-044836
Feb. 23, 1999 (JP) .......................... 11-044837

(51) Int. Cl.$^7$ ................................ H03K 3/00
(52) U.S. Cl. ................ 327/291; 327/165; 327/166
(58) Field of Search ............... 327/165, 166, 327/291, 294, 298, 293; 331/17

(56) References Cited

U.S. PATENT DOCUMENTS

| | | | | |
|---|---|---|---|---|
| 4,719,612 A | * | 1/1988 | Kenjyo | 369/54 |
| 5,781,049 A | * | 7/1998 | Fugo | 327/166 |
| 5,867,432 A | | 2/1999 | Toda | 365/194 |
| 5,986,949 A | | 11/1999 | Toda | 365/194 |
| 6,133,797 A | * | 10/2000 | Lovelace et al. | 331/17 |
| 6,184,813 B1 | * | 2/2001 | Abughazaleh et al. | 341/144 |
| 6,225,824 B1 | * | 5/2001 | Madhu et al. | 326/58 |

OTHER PUBLICATIONS

T. Saeki et al., "A 2.5ns Clock Access 250MHz 256Mb SDRAM with a Synchronous Mirror Delay", Feb. 10, 1996, ISSCC Digest of Technical Papers, pp. 374–375.

* cited by examiner

Primary Examiner—My-Trang Nu Ton
Assistant Examiner—Hiep Nguyen
(74) Attorney, Agent, or Firm—Banner & Witcoff, Ltd.

(57) ABSTRACT

A clock signal generator circuit comprises an off-chip driver, a first clock control circuit for outputting a first internal clock signal Tu synchronizing with an external clock signal CK, a second clock control circuit for outputting a second internal clock signal Td 180° out-of-phase with the external clock signal CK, a third clock control circuit for outputting a third internal clock signal aTx1 synchronizing with the first clock signal Tu and advanced in phase by at least the signal delay time in the off-chip driver, a fourth clock control circuit for outputting a fourth internal clock signal aTx2 synchronizing with the second clock signal Td and advanced in phase by at least the signal delay time in the off-chip driver, an OR circuit to which the third and fourth internal clock signals aTx1, aTx2 are inputted and which outputs a fifth internal clock signal aTx, and a fifth clock control circuit for outputting a sixth internal clock signal Tx which is in synchronization with the fifth internal clock signal aTx outputted from the OR circuit, has twice the frequency of the external clock signal CK, and is advanced in phase by the signal delay time in the off-chip driver.

29 Claims, 24 Drawing Sheets

| | | STATE OF CONTROL CIRCUIT | |
|---|---|---|---|
| | | SET | RESET |
| VALUE AT CLK LINE | H | PERMIT PULSE TO PASS | H |
| | L | PERMIT PULSE TO PASS | L |

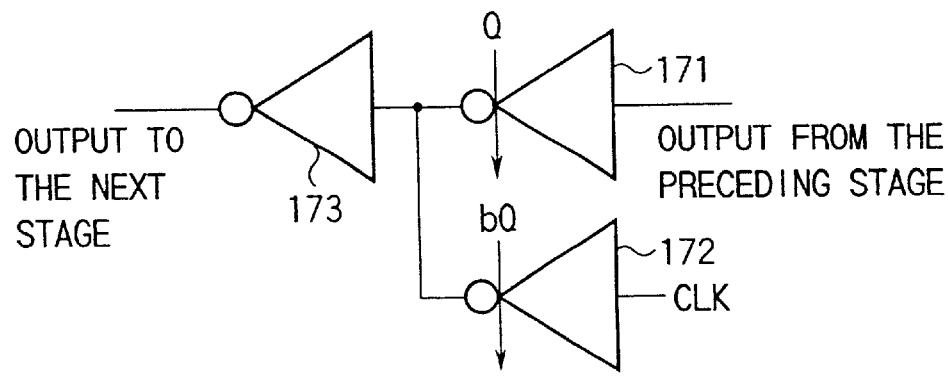
FIG. 44
| | | STATE OF CONTROL CIRCUIT | |
|---|---|---|---|
| | | SET | RESET |
| VALUE AT CLK LINE | H | PERMIT PULSE TO PASS | L |
| | L | PERMIT PULSE TO PASS | L |
FIG. 45
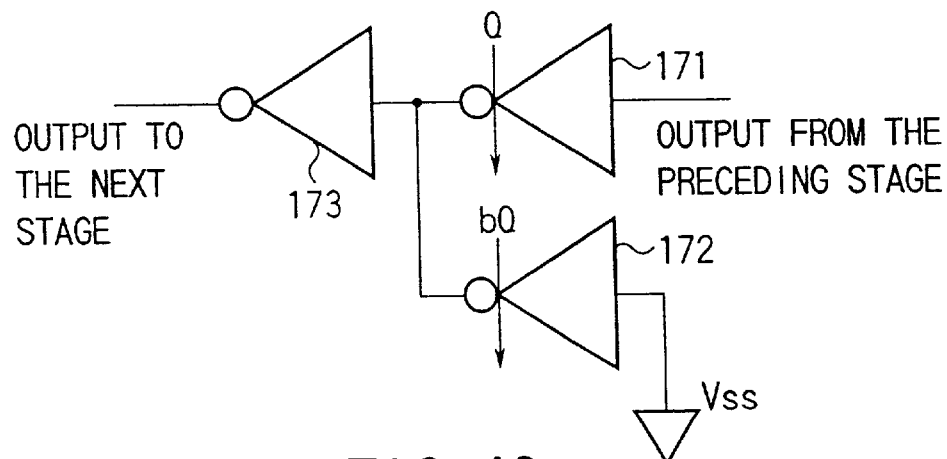
FIG. 46

CLOCK SIGNAL GENERATOR CIRCUIT AND SEMICONDUCTOR INTEGRATED CIRCUIT WITH THE SAME CIRCUIT

CROSS-REFERENCE TO RELATED APPLICATIONS

This application is based upon and claims the benefit of priority from the prior Japanese Patent Applications No. 11-044836, filed Feb. 23, 1999; and No. 11-044837, filed Feb. 23, 1999, the entire contents of which are incorporated herein by reference.

BACKGROUND OF THE INVENTION

This invention relates to a clock signal generator circuit for generating an internal clock signal synchronizing with a clock signal inputted from the outside of a chip and a semiconductor integrated circuit with the clock signal generator circuit, and more particularly to a semiconductor integrated circuit that has an off-chip driver which outputs the chip internal data outside the chip and whose operation is controlled on the basis of the clock signal generated at the clock signal generator circuit.

In the I/O section of semiconductor integrated circuits, including a semiconductor memory, such as a DRAM, the data has recently been inputted and outputted in synchronization with both of the leading edge and trailing edge of an external clock signal. Such a method is known as Double Data Rate (DDR) method. The DDR method enables data to be inputted and outputted twice as fast as a method of inputting and outputting the data in synchronization with either the leading edge or trailing edge of an external clock signal.

In a DDR type semiconductor circuit, three types of internal clock signals are generated in a chip to input and output the data in synchronization with both of the leading edge and trailing edge of an external clock signal. They are an internal clock signal Tu synchronizing with the leading edge of the external clock signal, an internal clock signal Td synchronizing with the trailing edge of the external clock signal, and an internal clock signal Tw synchronizing with both of the leading edge and trailing edge of the external clock signal.

In addition, an off-chip driver (OCD) acting as a data output circuit is provided in the I/O section of the chip. To perform output control of data, it is necessary to generate the internal clock signals, taking into account the signal delay time in the OCD, when there is a large delay time between the time a data output control internal clock signal is inputted to the OCD and the time the OCD outputs the data. Specifically, when the delay time in the OCD is so large that it cannot be ignored, it is necessary to generate an internal clock signal used to control the operation of the CD, the delay time of the OCD earlier than usual.

Various types of clock signal generator circuits for generating an internal clock signal in synchronization with an external clock signal have been considered. Of them, a Synchronous Mirror Delay (SMD) system used in "A 2.5-ns Clock Access 250-MHz 256-Mb SDRAM with a Synchronous Mirror Delay" ISSCC Digest of technical papers, pp. 374–375, February 1996 by T. Saeki, et al., and a Synchronous Adjustable Delay (SAD) system, including Synchronous Traced Backward Delay (STBD), disclosed in U.S. Pat. No. 5,867,432, issued to Haruki Toda, have been widely used because of the higher synchronous speed and less power consumption. The contents of which are incorporated herein by reference in the entirely.

The principle of a SAD clock signal generator circuit disclosed in U.S. Pat. No. 5,867,432 will be explained.

FIG. 1 is a block diagram of a SAD signal generator circuit.

The SAD signal generator circuit comprises an input buffer 11, a delay monitor circuit 12, a forward delay array 14 including a plurality of delay circuits 13 cascade-connected in a multistage manner, a backward delay array 16 including a plurality of delay circuits 15 cascade-connected in a multistage manner as equal the number of delay circuits 13 in the forward delay array 14, a control circuit 17, and an output buffer 18 to which the output of the backward delay array 16 is inputted. The control circuit 17 has as many state holding circuits (control elements) as equal the number of delay circuits in each of the forward delay array 14 and backward delay array 16. In FIG. 1, the circuit composed of the forward delay array 14, backward delay array 16, and control circuit 17 is called a SAD circuit SAD.

FIG. 2 is a timing chart to help explain an example of the operation of the clock signal generator circuit shown in FIG. 1. Consider a case where an external clock signal CK with a period of τ is inputted to the input buffer 11. The external clock signal CK is shaped in waveform and amplified by the input buffer 11 and the resulting signal is outputted as a pulse signal CLK. If the delay time in the input buffer 11 is D1, the pulse signal CLK lags behind the external clock signal CK by D1. The pulse signal CLK is inputted to the delay monitor circuit 12 and the control circuit 17 of the SAD circuit SAD.

The delay monitor circuit 12 has a delay time of A (=D1+D2) equal to the sum of the delay time D1 in the input buffer 11 and the delay time D2 in the output buffer 18. Thus, as shown in FIG. 2, the pulse signal Din outputted from the delay monitor circuit 12 lags behind the pulse signal CLK outputted from the input buffer 11 by a period of A and is inputted as a signal Din to the forward delay array 14.

The forward delay array 14 is composed of delay circuits 13 cascade-connected in a multistage manner as described earlier. During the time until the pulse signal CLK in the next cycle is inputted to the control circuit 17, the signal Din is delayed sequentially by the multistage cascade-connected delay circuits 13. After the pulse signal CLK in the next cycle has been inputted to the control circuit 17, the backward delay array 16 delays the pulse signal CLK in the next cycle sequentially. On the basis of the state where the forward pulse signal propagates along the forward delay array 14, the control circuit 17 controls the operation of the backward delay array 16 in such a manner that the propagation time of the backward pulse signal becomes equal to that of the forward pulse signal. Thus, the pulse signal CLK in the next cycle is delayed for the time (τ−A) by the backward delay array 16. The output Dout of the backward delay array 16 is delayed for the time D2 and the resulting signal is outputted as an internal clock signal CK'.

If the delay time from when the external clock signal CK is inputted until the internal clock signal CK' is outputted is $\Delta_{total}$, then $\Delta_{total}$ is expressed as:

$$\Delta_{total} = D1 + A + 2(\tau - A) + D2 \quad (1)$$

Since D1+D2=A, $\Delta_{total}$ is 2τ and the internal clock signal CK' synchronize with the external clock CK, starting at the third clock in the external clock signal CK.

In the clock signal generator circuit of FIG. 1, when the number of delay circuits 15 in the backward delay array 16 is reduced to half the number of delay circuits 13 in the forward delay array 14 so that the delay time in the backward delay array 16 may be half the delay time in the forward delay array 14 and the delay time in the delay monitor circuit 12 is set to twice the delay time of FIG. 1 (or to 2A), the internal clock signal CK' is 180° out-of-phase with the external clock signal CK.

FIG. 3 is a block diagram of a conventional SAD type clock signal generator circuit for generating an internal clock signal used to control an off-chip driver. The SAD type clock generator circuit comprises a clock control circuit 21 for generating an internal clock signal Tu synchronizing with an external clock signal CK from the external clock signal CK, a clock control circuit 22 for generating an internal clock signal Td 180° out-of-phase with the external clock signal CK, an OR circuit 23 to which the internal clock signals Tu and Td are inputted and which generates an internal clock signal Tw, and a clock control circuit 24 for generating an internal clock signal Tx of twice the frequency of the external clock signal CK from the internal clock signal Tw.

As shown in FIG. 4, the clock control circuit 21 is composed of an input buffer 11, a delay monitor circuit 12, a SAD circuit SAD1, and an output buffer 18 as is the circuit of FIG. 1. In the clock control circuit 21, the delay monitor circuit 12 is so set that it has the amount of delay equivalent to the sum of the signal delay time in one input buffer and that in one output buffer. Then, the clock control circuit 21 outputs an internal clock signal Tu synchronizing with the external clock signal CK.

As shown in FIG. 5, the clock control circuit 22 is composed of an input buffer 11, a delay monitor circuit 12, a SAD circuit SAD2, and an output buffer 18 as is the circuit of FIG. 1. In the clock control circuit 22, the delay monitor circuit 12 is so set that it has the amount of delay equivalent to the sum of the signal delay time in two input buffers and that in two output buffers. The number of delay circuits in the backward delay array 16 of the SAD circuit SAD2 is reduced to half the number of delay circuits in the forward delay array 14. Thus, the clock control circuit 22 outputs an internal clock signal Td 180° out-of-phase with the external clock signal CK.

Then, when both of the internal clock signals Tu and Td are inputted to the OR circuit 23 of FIG. 3, the OR circuit 23 outputs an internal clock signal Tw of twice the frequency of the external clock signal CK. Because the internal clock signal Tw outputted from the OR circuit 23 includes the signal delay time in the OR circuit 23, it cannot be used as a control clock signal for controlling the off-chip driver.

To avoid this problem, the internal clock signal Tw outputted from the OR circuit 23 is inputted to the clock control circuit 24, which then outputs an internal clock signal Tx compensated for the signal delay time in the OR circuit 23.

The clock control circuit 24 is composed of a delay monitor circuit 12, a SAD circuit SAD3, and an output buffer 18 as shown in FIG. 6. The delay monitor circuit 12 includes an OR circuit 25 with a delay time equal to that of the OR circuit 23 and an output buffer 26 with a delay time equal to that of the output buffer 18.

The clock control circuit 24 of FIG. 6 compensates for the signal delay time in the OR circuit 23 of FIG. 3 and the signal delay time in the output buffer 28 for outputting the internal clock signal Tx and produces an internal clock signal Tx having twice the frequency of the external clock signal CK.

The internal clock signal Tx must have a great driving capability, because it is distributed to various parts of the chip. For this reason, the output buffer 18 in the clock control circuit 24 must have a large buffer capability. Therefore, to compensate for the delay time in the output buffer 18, the clock control circuit 24 using the SAD circuit of FIG. 6 is needed.

In addition, when the delay time in the OCD is large and the internal clock signal Tx must be caused to lead the external clock signal by that amount of delay, the clock control circuit 24 is also needed.

Even when each clock control circuit is in synchronization, there is an offset-error-caused synchronization error in each clock control circuit. For example, it is assumed that the SAD circuit SAD1 of FIG. 4 has a synchronization error of $\Delta\tau 1$ and the SAD circuit SAD2 shown in FIG. 5 has a synchronization error of $\Delta\tau 2$. In this case, as shown in the timing chart of FIG. 7, a synchronization error of $\Delta\tau 1$ occurs in the internal clock signal Tu as compared with the ideal internal clock signal Tu without a synchronization error shown by a broken line. Similarly, a synchronization error of $\Delta\tau 2$ occurs in the internal clock signal Td as compared with the ideal internal clock signal Td without a synchronization error shown by a broken line. Then, the internal clock signal Tw after the internal clock signals Tu and Td are ORed changes alternately in the periods of $\tau 1$ and $\tau 2$. The periods $\tau 1$ and $\tau 2$ are expressed by the following equations:

$$\tau 1 = (1/2)\tau + (\Delta\tau 1 - \Delta\tau 2) \quad (2)$$

$$\tau 2 = (1/2)\tau - (\Delta\tau 1 - \Delta\tau 2) \quad (3)$$

In a case where an attempt is made to cause the clock control circuit 24 of FIG. 6 to produce an internal clock signal Tx from the internal clock signal Tw with the period $\tau 1$ of FIG. 7 and the internal clock signal Tw with the period $\tau 2$ in the next cycle, when the SAD circuit SAD3 has no synchronization error as shown in FIG. 7, a shift in the actual internal clock signal Tx from the ideal internal clock signal Tx shown by a broken line is $-\Delta\tau 1 + 2\Delta\tau 2$. If the shift of $\tau 1$ is opposite to that of $\tau 2$, the difference between the actual internal clock signal Tx and the ideal internal clock signal Tx is very large.

For example, if $\Delta\tau 1 = \Delta\tau$ and $\Delta\tau 2 = -\Delta\tau$, the phase shift is tripled by the SAD circuit SAD3 to $3\Delta\tau$, even when there is no synchronization error in the SAD circuit SAD3. If another synchronization error of $\Delta\tau$ occurs in the SAD circuit SAD3, the total error is $4\Delta\tau$, meaning that the internal clock signal Tx has four times the synchronization error in each SAD circuit.

As described above, in the clock signal generator circuit of FIG. 3, the synchronization error is amplified by each SAD circuit. When the amplified error becomes a problem in terms of the operation of the chip, it is necessary to use a Phase Locked Loop (PLL) circuit or a Delay Locked Loop (DLL) circuit in place of the SAD circuit SAD3.

However, since the PLL circuit and DLL circuit consume more electric power and are slower in synchronous speed than the SAD circuit, the overall power consumption increases and the total synchronous speed decreases.

On the other hand, in a semiconductor integrated circuit that operates at high speed, not only the internal clock signals synchronizing with the external clock signal and having the same phase but also internal clock signals 90° or 180° out-of-phase with the external clock signal and an internal clock with a double period are used. Those clock signals are produced by a combination of clock control circuits.

As an example, FIG. 8 shows the configuration of a clock signal generator circuit that generates an internal clock signal Tu synchronizing with the external clock signal and an internal clock signal Td 180° out-of-phase with the external clock signal.

In the clock signal generator circuit, a clock control circuit 31 generates an internal clock signal Tu from the external clock signal CK and a clock control circuit 32 generates an internal clock signal Td from the internal clock signal Tu.

FIGS. 4 and 9 show the configuration of the clock control circuits 31, 32 using a SAD circuit, respectively.

FIG. 9 shows a detailed configuration of the clock control circuit 32 that generates an internal clock signal Td. The clock control circuit 32 is composed of a delay monitor circuit 33, a SAD circuit SAD4 including a forward delay array 34 and a backward delay array 35, and an output buffer 36. The backward delay array 35 has half the delay time of the forward delay array 34.

In the delay monitor circuit 33, two buffers 37, 37 whose circuit configuration and circuit pattern are equivalent to those of the output buffer 36 are connected in series so that they may have the signal delay time equal to that of two units of the output buffer 36.

As described earlier, in the SAD type clock control circuit, the internal clock signal synchronizes with the external clock signal the three clocks or more after the start of the supply of the external clock signal. As a result, an asynchronous pulse signal is outputted from the clock control circuit before synchronization is established.

FIG. 10 is a timing chart to help explain an example of the operation of the clock signal generator circuit of FIG. 8 when the SAD type clock control circuit as shown in FIG. 4 or 9 is used. In FIG. 10, signal Din is the input signal to the SAD circuit SAD1 and signal Dout is the output signal from the SAD circuit SAD1.

As shown in FIG. 10, one clock control circuit 31 outputs a clock signal Tu not synchronized with the external clock signal CK as shown by C1, before the clock signal Tu (C2) synchronizing with the external clock signal CK is outputted. Because the other clock control circuit 32 starts the synchronizing operation with the internal clock signal Tu of C1, it outputs an internal clock signal Td at the position shown by C1'. However, since the duration between C1 and C2 is a period of τ', not the original period τ, the clock control circuit 32 starts a synchronizing operation as if the period were τ'.

As a result, as shown in FIG. 10, the gap between the clock signal C1' generated from the clock signal C1 and the clock signal C2' generated from the synchronous clock signal C2 becomes too narrow.

FIG. 10 shows the external clock signal CK when the duty is 50%, or when the high-level period is equal to the low-level period. However, when the duty of the external clock signal CK becomes high and the period of the high level becomes longer, the period of C1' overlaps with that of C2', with the result that the timing with which synchronization lags behind to the clock signal C3' following the clock signal C2'.

In addition, the clock control circuit 32 outputs the asynchronous clock signal C1' and other asynchronous clock signals before it outputs the synchronous clock signal C3'. When the internal clock signal Td is inputted to another clock control circuit, the clock control circuit also starts a synchronizing operation with the asynchronous clock signal and is therefore late in establishing synchronization.

For the above reasons, the clock signal generator circuit with more than one clock control circuit is on the whole late in establishing synchronization, even when using a high-synchronous-speed SAD type clock control circuit.

Therefore, it is necessary to operate the clock control circuit earlier than the time a synchronizing clock signal is needed or cause the clock control circuit to continue operating even when the synchronizing clock signal is unnecessary. Operating the clock control circuit in the unnecessary period increases the standby power of the entire chip, because more electric power is consumed during the period.

BRIEF SUMMARY OF THE INVENTION

A first object of the present invention is to provide a clock signal generator circuit capable of reducing synchronization errors without using a PLL circuit and a DLL circuit and a semiconductor integrated circuit having the clock signal generator circuit.

A second object of the present invention is to provide a clock signal generator circuit which enables entire synchronization at high speed by providing a control circuit not outputting a clock signal until it synchronizes with an input clock signal between two clock control circuits and stops the operation in an unnecessary period, thereby preventing the standby power from increasing.

A third object of the present invention is to provide a clock signal generator circuit which enables entire synchronization at high speed by providing a configuration preventing a clock signal to be outputted until synchronization is established with an input clock signal and stops the operation in an unnecessary period, thereby preventing the standby power from increasing.

According to a first aspect of the present invention, there is provided a clock signal generator circuit comprising: an off-chip driver which has a specific signal delay time from when a control signal is inputted until it outputs data and which outputs data on the basis of the control signal; a first clock control circuit which receives a first clock signal and outputs a second clock signal synchronizing with the first clock signal and advanced in phase by at least the signal delay time in the off-chip driver; a second clock control circuit which receives a third clock signal and outputs a fourth clock signal synchronizing with the third clock signal, advanced in phase by at least the signal delay time in the off-chip driver, and having the same frequency as the second clock signal, and different in phase from the second signal; and an OR circuit which receives the second clock signal and the fourth clock signal and outputs a fifth clock signal for controlling the data output operation of the off-chip driver.

According to a second aspect of the present invention, there is provided a clock signal generator circuit comprising: an off-chip driver which outputs data on the basis of a control signal and has a different signal delay time from when the control signal is inputted until the data is outputted in outputting high-level data from the signal delay time in outputting low level data; a first control signal generator circuit which generates a first control signal inputted to the off-chip driver when the off-chip driver outputs high-level data; and a second control signal generator circuit which generates a second control signal inputted to the off-chip driver when the off-chip driver outputs low-level data.

According to a third aspect of the present invention, there is provided a clock signal generator circuit comprising: a first clock control circuit which receives a first clock signal and outputs a second clock signal; a control circuit which cuts off at least the first one of the second clock signals outputted from the first clock control circuit and thereafter sequentially outputs a group of pulse signals outputted from the first clock control circuit; and a second clock control circuit which receives the group of pulse signals outputted from the control circuit and outputs a third clock signal.

According to a fourth aspect of the present invention, there is provided a clock signal generator circuit comprising: a first clock control circuits which includes a first delay monitor circuit which receives a first clock signal, and a first synchronous adjusting delay circuit which has a first forward delay array and a first backward delay array, receives the first clock signal and the clock signal outputted from the first delay monitor circuit, causes the first forward delay array to delay, for a specific time, the clock signal outputted from the first delay monitor circuit after the input of the first clock signal in a first cycle, causes the first backward delay array to delay the first clock signal in a second cycle following the first cycle for the time equivalent to the delay time in the clock signal delayed by the first forward delay array or n/m of the delay time (where n and m are positive integers), after the first clock signal in the second cycle has arrived, and which outputs a second clock signal; a control circuit which is inserted between the input node of the first clock signal and the first synchronous adjusting delay circuit of the first clock control circuit and which cuts off at least the first one of the first clock signals and thereafter sequentially outputs the first clock signals supplied to the input node; and a second clock control circuit which receives the second clock signal from the first clock control circuit and outputs a third clock signal.

According to a fifth aspect of the present invention, there is provided a clock control circuit comprising: an input buffer which receives a clock signal; a delay monitor circuit to which the output of the input buffer is inputted and which has a specific amount of signal delay; a first delay array which is composed of a plurality of first delay circuits cascade-connected in a multistage manner and causes the cascade-connected first delay circuits to delay the output of the delay monitor circuit sequentially; a sense circuit to which the output of the delay monitor circuit is inputted and which senses a first delay circuit through which the output of the delay monitor circuit has passed in the first delay array during one period from when the delay monitor circuit outputs the clock signal in a first cycle until the clock signal in a second clock following the first cycle is outputted; a second delay array which is composed of a plurality of second delay circuits cascade-connected in a multistage manner and which causes the second delay circuit at the stage corresponding to the result of the sensing at the sense circuit to select the clock signal in the second cycle outputted from the delay monitor circuit, and sequentially delays the selected clock signal through the second delay circuits at the stages following the stage corresponding to the result; and an output buffer to which the output of the second delay array is inputted, wherein the delay monitor circuit has the amount of signal delay equivalent to the sum of the amount of signal delay in the input buffer and that in the output buffer and the second delay circuit at least the last stage in the second delay array delays only the output of the second delay circuit at the preceding stage without receiving the clock signal outputted from the delay monitor circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 44 is a circuit diagram showing a concrete configuration of the delay circuits in the backward delay array for performing the logical operation of FIG. 37;

FIG. 45 is a table to help explain the logical operation of the delay circuits in the backward delay array used in a clock signal generator circuit according to a tenth embodiment of the present invention; and FIG. 46 is a circuit diagram showing a concrete configuration of the delay circuits in the backward delay array used in the clock signal generator circuit of the tenth embodiment.

DETAILED DESCRIPTION OF THE INVENTION

Hereinafter, referring to the accompanying drawings, embodiments of the present invention will be explained.

Figure 11:
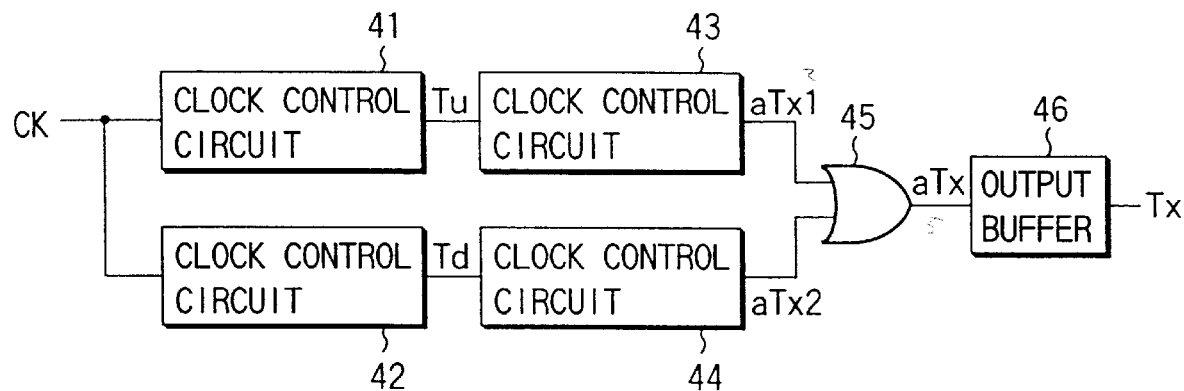
FIG. 11 is a block diagram of a clock signal generator circuit according to a first embodiment of the present invention.

FIG. 11 is a block diagram of a clock signal generator circuit according to a first embodiment of the present invention. The clock signal generator circuit comprises a clock control circuit 41 for taking in an external clock signal CK and outputting an internal clock signal Tu synchronizing with the external clock signal CK, a clock control circuit 42 for taking in the external clock signal CK and outputting an internal clock signal Td 180° out-of-phase with the external clock signal CK, a clock control circuit 43 to which the internal clock signal Tu is inputted and which outputs an internal clock signal aTx1 that synchronizes with the internal clock signal Tu and is advanced in phase by at least the signal delay time in an off-chip driver, a clock control circuit 44 to which the internal clock signal Td is inputted and which outputs an internal clock signal aTx2 that synchronizes with the internal clock signal Td and is advanced in phase by at least the signal delay time in the off-chip driver, an OR circuit 45 to which both of the internal clock signals aTx1 and aTx2 are inputted, and an output buffer 46 to which the input clock signal aTx outputted from the OR circuit 45 is inputted and which outputs an internal clock signal Tx.

The internal clock signal Tx outputted from the output buffer 46 is used as a control clock signal for controlling the data output operation of the off-chip driver provided in the same semiconductor integrated circuit. In the first embodiment, the internal clock signal Tx has twice the frequency of the external clock signal CK and is used as a control clock signal in the DDR method.

Figure 12:
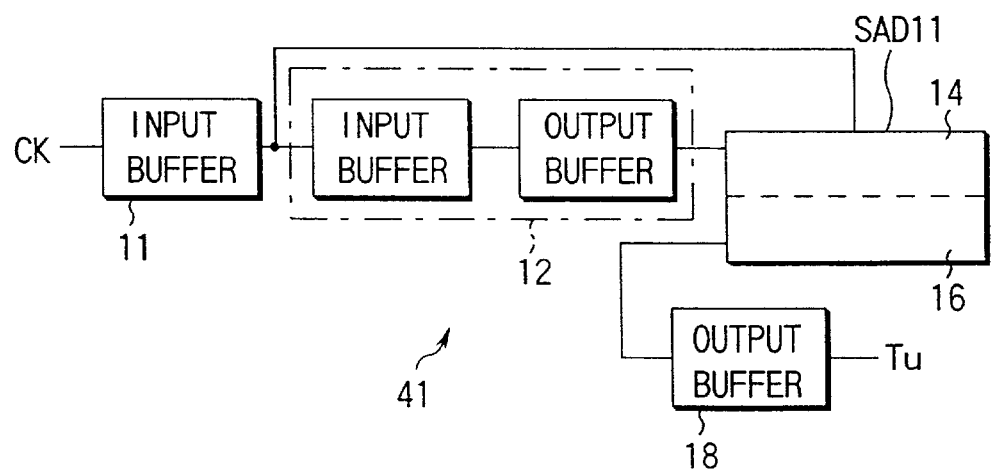
FIG. 12 shows a detailed configuration of a clock control circuit in FIG. 11.

FIG. 12 shows a detailed configuration of the clock control circuit 41 in FIG. 11. Like the clock control circuit of FIG. 4, the clock control circuit 41 is composed of an input buffer 11, a delay monitor circuit 12, a SAD circuit SAD11, and an output buffer 18. In the clock control circuit 41, the delay monitor circuit 12 is designed to have the amount of delay equivalent to the sum of the signal delay time of a single input buffer and that of a single output buffer. A plurality of delay circuits are provided in a backward delay array 16 of the SAD circuit SAD11. The clock control circuit 41 outputs an internal clock signal Tu synchronizing with the external clock signal CK.

Figure 13:
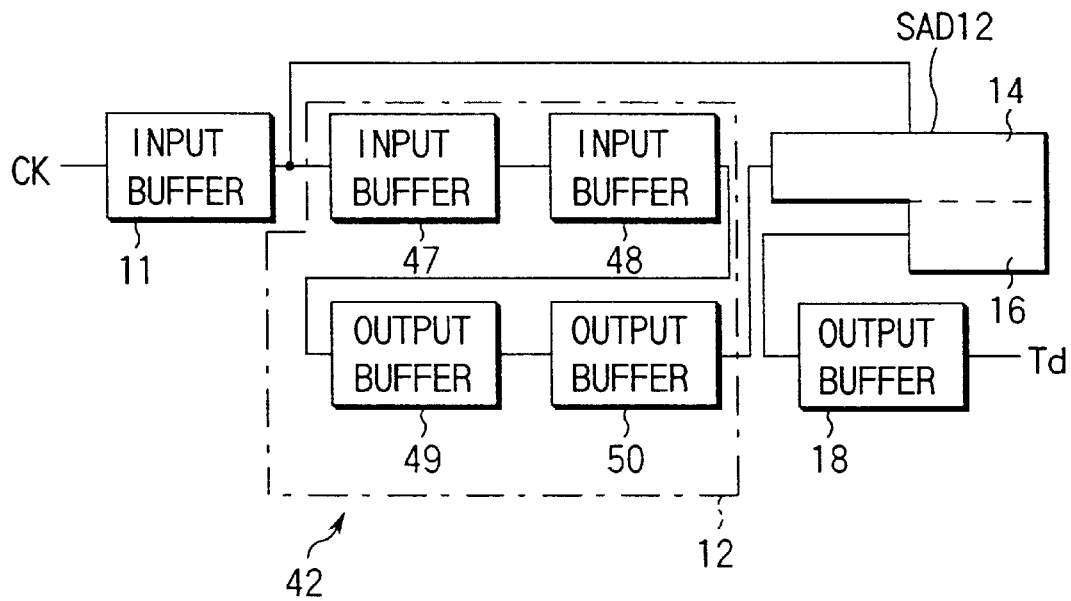
FIG. 13 shows a detailed configuration of another clock control circuit in FIG. 11.

FIG. 13 shows a detailed configuration of the clock control circuit 42 in FIG. 11. Like the clock control circuit of FIG. 4, the clock control circuit 42 is composed of an input buffer 11, a delay monitor circuit 12, a SAD circuit SAD12, and an output buffer 18. In the clock control circuit 42, the delay monitor circuit 12 is designed to have the amount of delay equivalent to the sum of the signal delay time of two input buffers and that of two output buffers.

Specifically, the delay monitor circuit 12 is composed of two input buffers 47, 48 equivalent in circuit configuration to the input buffer 11 of the clock control circuit 42 and two output buffers 49, 50 equivalent in circuit configuration to the output buffer 18 of the clock control circuit 42.

The number of delay circuits in the backward delay array 16 of the SAD circuit SAD12 is halved. As a result, the clock control circuit 42 outputs an internal clock signal Td 180° out-of-phase with the external clock signal CK.

Figure 14:
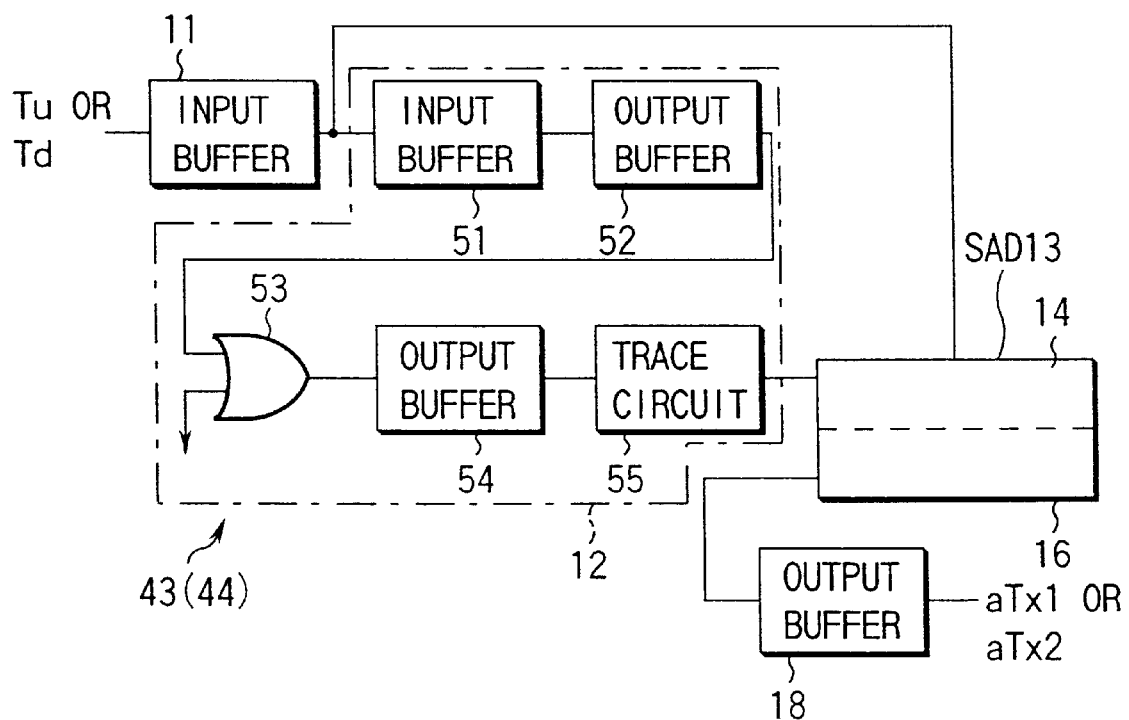
FIG. 14 shows a detailed configuration of still another clock control circuit in FIG. 11.

FIG. 14 shows a detailed configuration of clock control circuits 43 and 44 in FIG. 11. The clock control circuits 43 and 44 are the same except that an input clock signal Tu is inputted to the clock control circuit 43 and an input clock signal Td is inputted to the clock control circuit 44. Therefore, explanation of both of them will be given at the same time.

Figure 4:
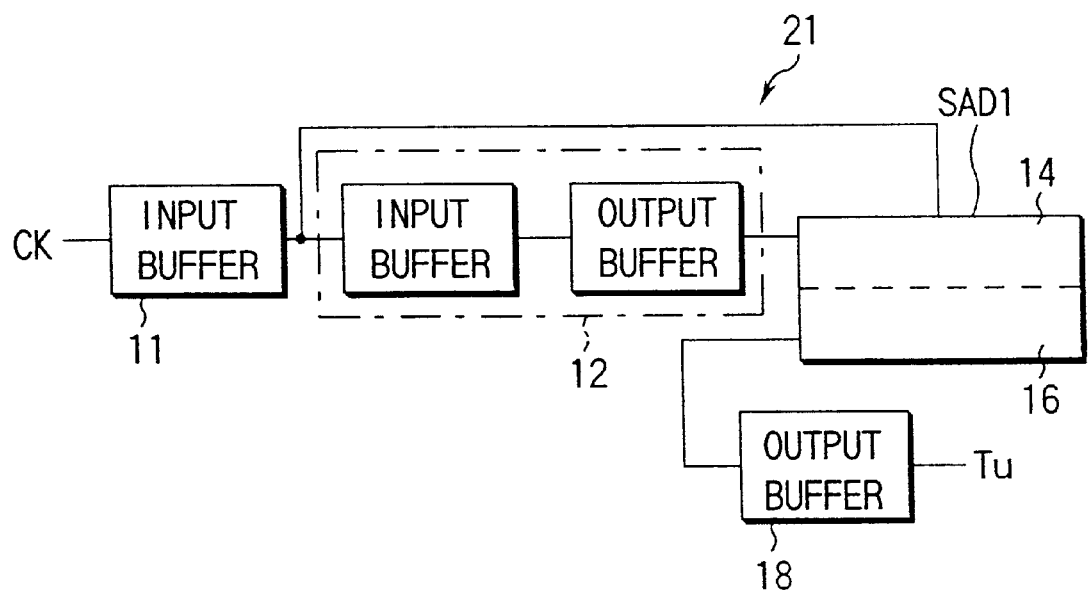
FIG. 4 is a circuit diagram of the clock control circuit in FIG. 3.
Figure 5:
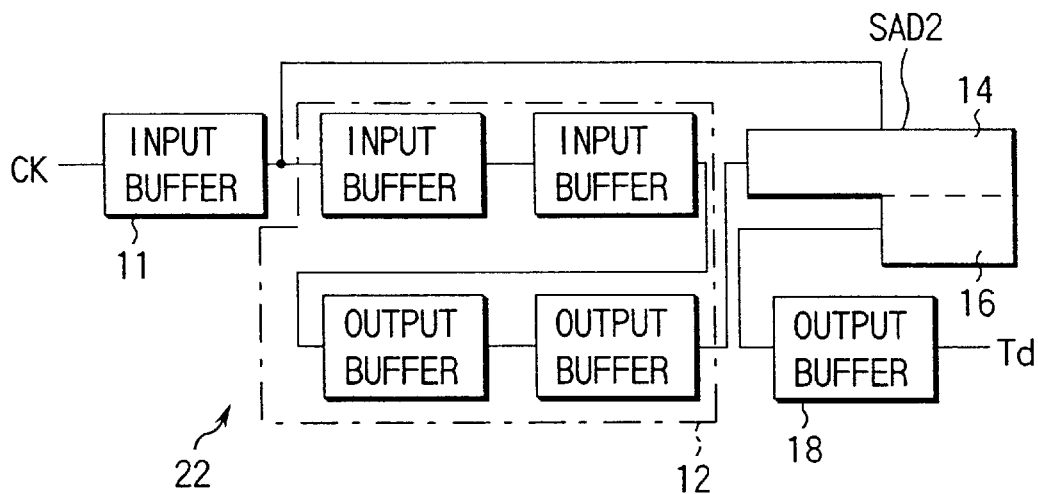
FIG. 5 is a circuit diagram of the clock control circuit in FIG. 3.
Figure 6:
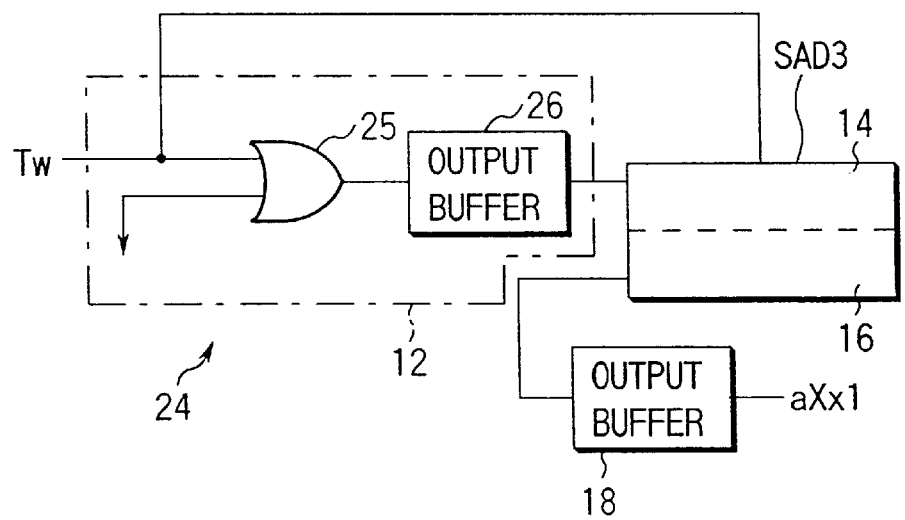
FIG. 6 is a circuit diagram of the clock control circuit in FIG. 3.
Figure 7:
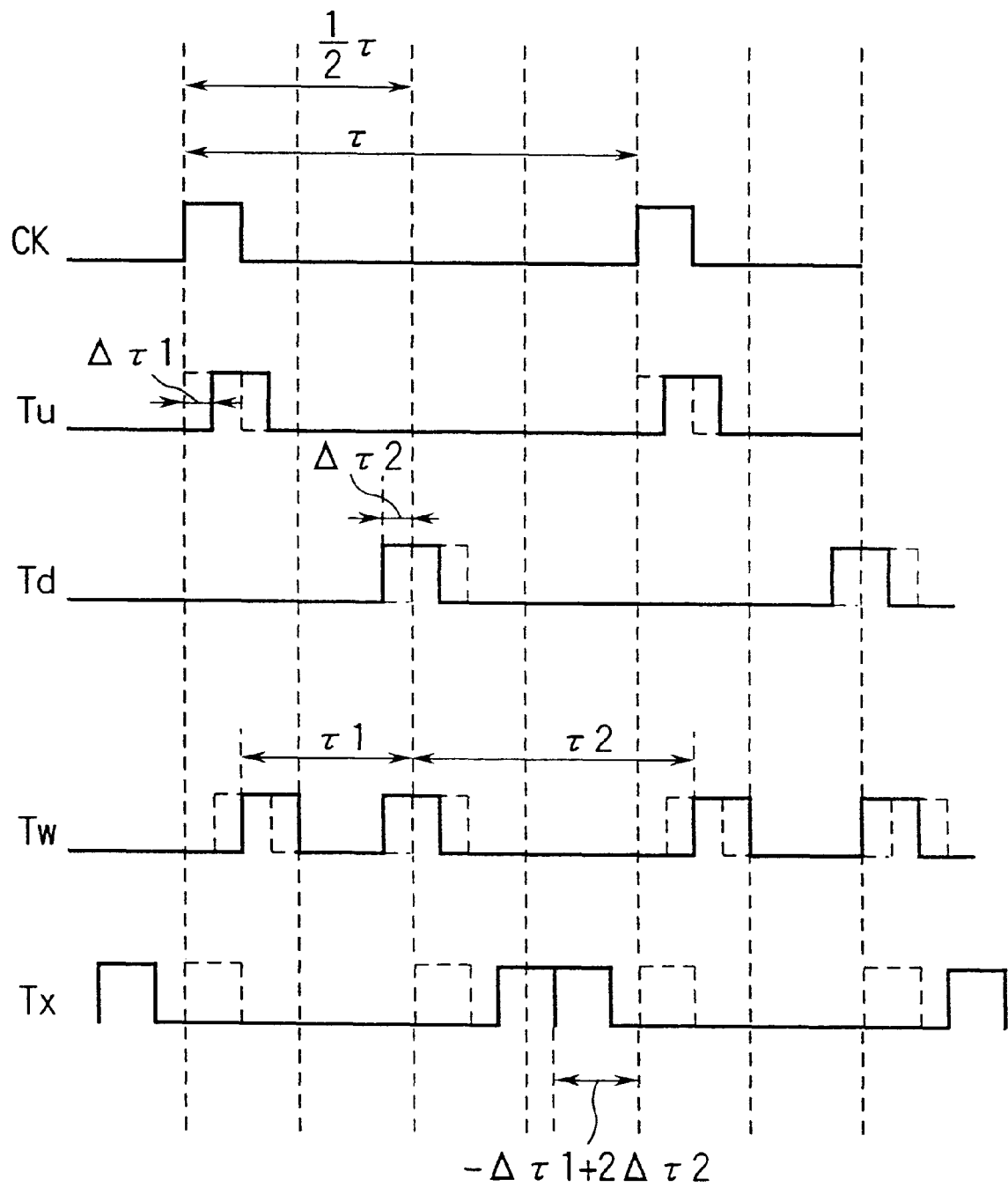
FIG. 7 is a timing chart to help explain an example of the operation of the circuit in FIG. 3.
Figure 8:
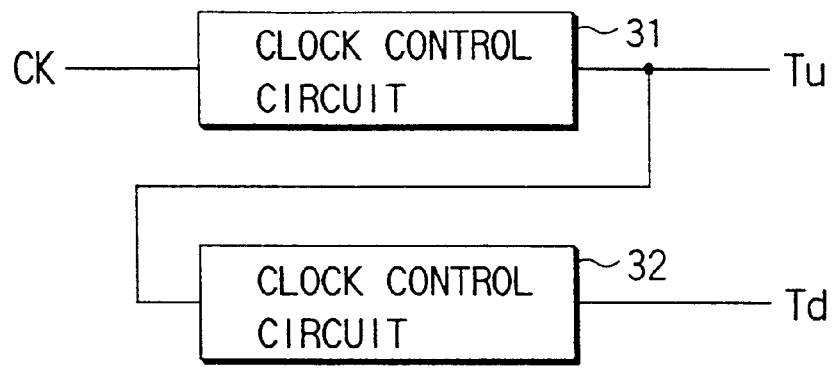
FIG. 8 is a block diagram of a conventional clock signal generator circuit using the clock control circuit of FIG. 1.
Figure 9:
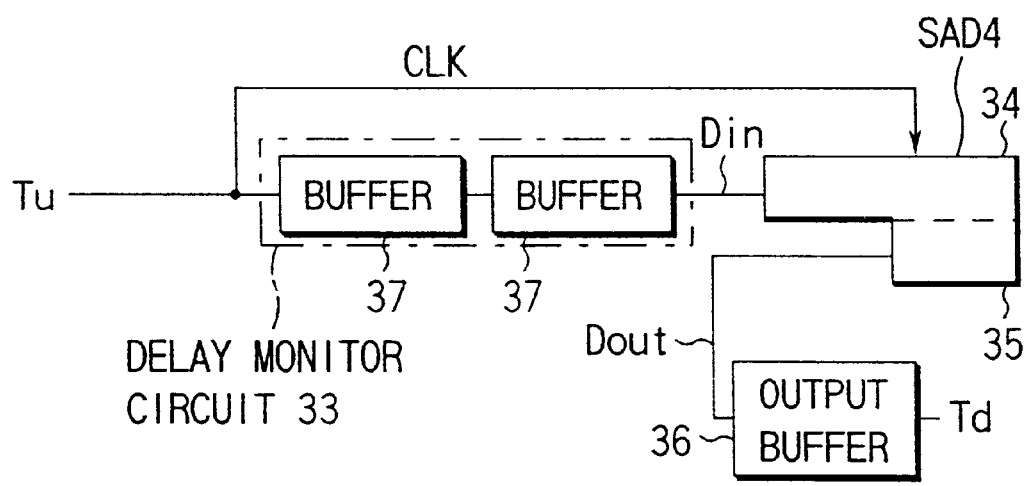
FIG. 9 is a circuit diagram of the clock control circuit in FIG. 8.
Figure 10:
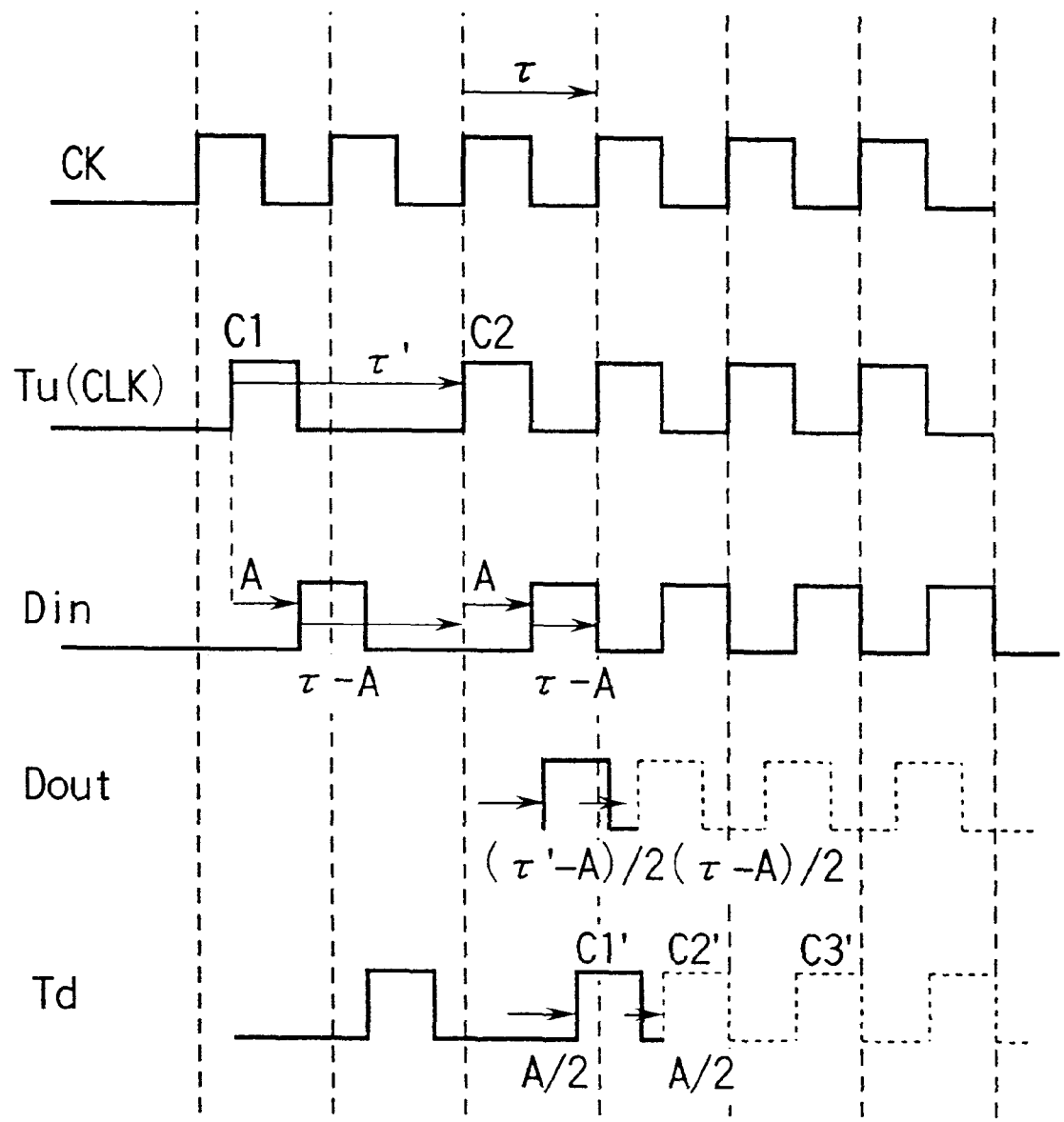
FIG. 10 is a timing chart to help explain an example of the operation of the clock signal generator circuit in FIG. 8.

Like the clock control circuit of FIG. 4, each of the clock control circuits 43 and 44 is composed of an input buffer 11, a delay monitor circuit 12, a SAD circuit SAD13, and an output buffer 18. In each of the clock control circuits 43 and 44, the delay monitor circuit 12 is designed to have the amount of delay equal to the total sum of the amount of delay equivalent to the sum of the signal delay time of a single input buffer and that of a single output buffer, the amount of delay equivalent to the signal delay time of the OR circuit 45 in FIG. 11, the amount of delay equivalent to the signal delay time of the output buffer 46 in FIG. 1 to which the output of the OR circuit 55 is inputted, and the amount of delay equivalent to the signal delay time of the off-chip driver.

Specifically, the delay monitor circuit 12 is composed of a cascade connection of the following circuits: an input buffer 51 equivalent in circuit configuration to the input buffer 11 in each of the clock control circuits 43 and 44, an output buffer 52 equivalent in circuit configuration to the output buffer 18 in each of the clock control circuits 43 and 44, an OR circuit equivalent in circuit configuration to the OR circuit of FIG. 11 and grounded at one end, an output buffer 54 equivalent in circuit configuration to the output buffer 46 of FIG. 11, and a trace circuit 55 to which an internal clock signal Tx is supplied and which has not only a circuit configuration and circuit pattern equivalent to those of the off-chip driver (not shown) whose data output operation is controlled on the basis of the internal clock signal Tx but also virtually the same signal delay time as that of the off-chip driver.

The clock control circuits 43 and 44 basically output internal clock signals aTx1 and aTx2 synchronizing with the internal clock signals Tu and Td, respectively.

In the middle of the propagation route of the clock signal in the delay monitor circuit 12, the following circuits are inserted: an OR circuit 53 which has a circuit configuration equivalent to that of the OR circuit 45 in FIG. 11 and the amount of signal delay substantially equal to that of the OR circuit 45, an output buffer 54 which has a circuit configuration equivalent to that of the output buffer 46 and the amount of signal delay substantially equal to that of the output buffer 46, and a trace circuit 55 which has not only a circuit configuration and circuit pattern equivalent to those of the off-chip driver but also virtually the same signal delay time as that of the off-chip driver. This causes the input to the SAD circuit SAD13 to lag behind by the total sum of the delay times of the respective circuits. As a result, the internal clock signal aTx1 or aTx2 outputted from the output buffer 18 caused to lead the internal clock signal Tu or Td in phase by the sum of the signal delay time in the OR circuit 45, the signal delay time in the output buffer 54, and the signal delay time in the off-chip driver.

Then, the internal clock signals aTx1 and aTx2 are inputted to the OR circuit 45 of FIG. 11, which produces a clock signal aTx. The clock signal aTx is inputted to the output buffer 46, which then outputs an internal clock signal Tx.

After the internal clock signals aTx1 and aTx2 have passed through the OR circuit 45, the phase of the internal clock signals aTx1 and aTx2 advanced beforehand by the signal delay time of the OR circuit 45 lags behind by that much, producing a clock signal aTx. The clock signal aTx passes through the output buffer 46, causing the phase of the internal clock signal aTx advanced beforehand by the signal delay time of the output buffer 46 to lag behind by that much, which produces a clock signal Tx. As a result, the obtained internal clock signal Tx has twice the frequency of the external clock signal CK and leads from the external clock signal CK in phase by the signal delay time of the off-chip driver.

Specifically, since the data output operation is controlled using the clock signal Tx, the data output timing of the off-chip driver is synchronized with the external clock signal CK, which prevents the data output operation from lagging behind the external clock signal CK.

Figure 15:
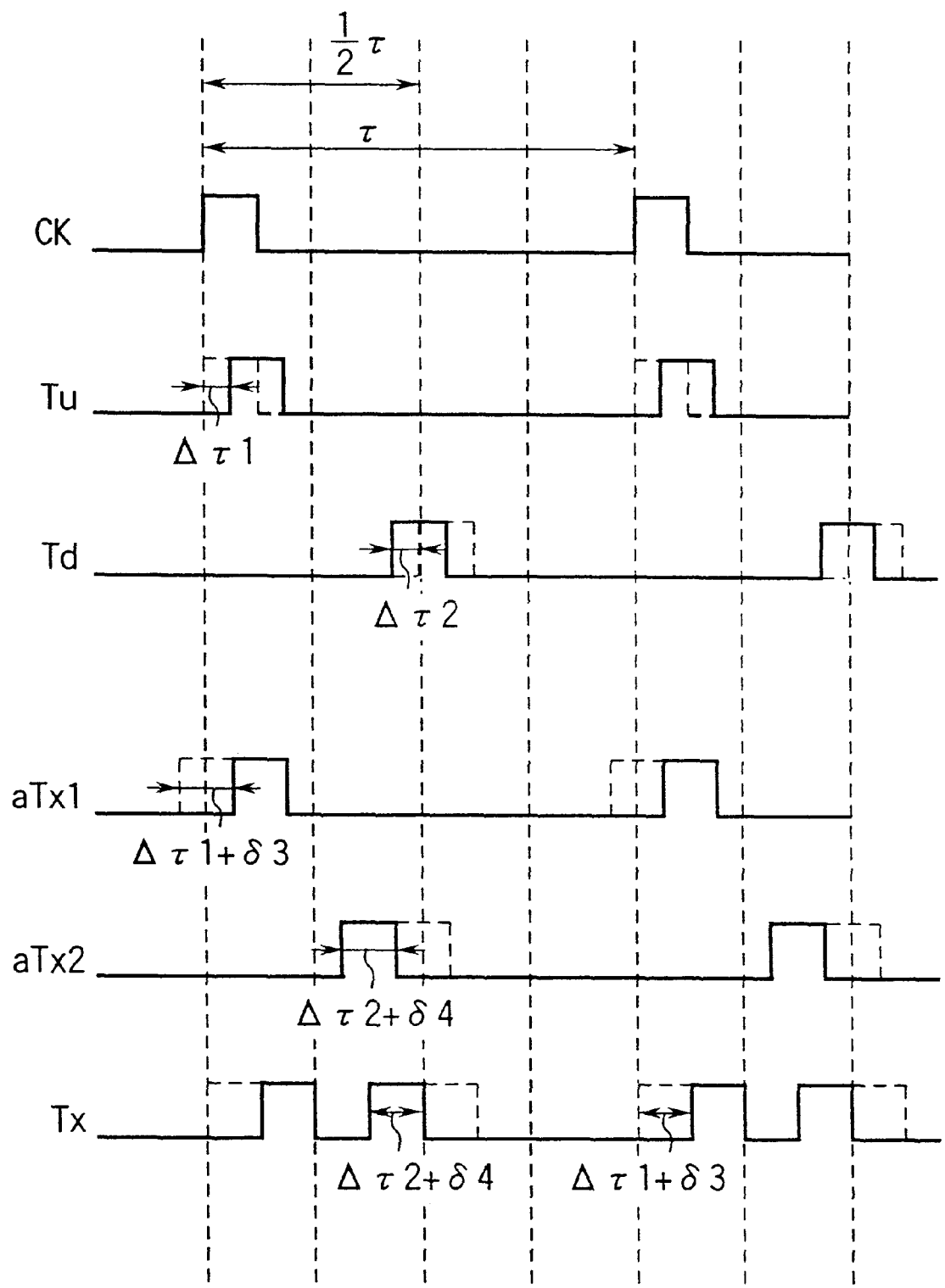
FIG. 15 shows a timing chart to help explain an example of the operation of the clock signal generator circuit in FIG. 11.

FIG. 15 is a timing chart to explain an example of the operation of the clock signal generator circuit according to the first embodiment. For example, it is assumed that there are a synchronization error of $\Delta\tau 1$ in the SAD circuit SAD11 in the clock control circuit 41 shown in FIG. 12 and a synchronization error of $\Delta\tau 2$ in the SAD circuit SAD12 in the clock control circuit 42 of FIG. 13. In this case, as shown in FIG. 15, a synchronization error of $\Delta\tau 1$ occurs in the internal clock signal Tu as compared with an ideal internal clock signal Tu without a synchronization error shown by a broken line. Similarly, a synchronization error of $\Delta\tau 2$ takes place in the internal clock signal Td as compared with an ideal internal clock signal Td without a synchronization error shown by a broken line. In one clock control circuit 43 shown in FIG. 14, a synchronization error (e.g., $\delta 3$) in the SAD circuit SAD13 is just added to the synchronization error $\Delta\tau 1$ in the internal clock signal Tu. As a result, the output clock signal aTx1 has a synchronization error of $\Delta\tau 1+\delta 3$ as compared with an ideal internal clock signal aTx1 without a synchronization error shown by a broken line.

Similarly, in the other clock control circuit 44 of FIG. 14, a synchronization error (e.g., $\delta 4$) in the SAD circuit SAD13 is just added to the synchronization error $\Delta\tau 2$ in the internal clock signal Td. As a result, the output clock signal aTx2 has a synchronization error of $\Delta\tau 2+\delta 4$ as compared with an ideal internal clock signal aTx2 without a synchronization error shown by a broken line. Thereafter, both of the clock signals aTx1 and aTx2 are ORed by the OR circuit 45. Because the resulting signal does not pass through the SAD circuit, a synchronization error in the clock signal Tx is either $\Delta\tau 1+\delta 3$ or $\Delta\tau 2+\delta 4$ included originally in the clock signals aTx1 and aTx2.

For example, if a synchronization error in each SAD circuit is $\Delta\tau$ as in a conventional equivalent, a synchronization error included in the internal clock signal Tx is $2\Delta\tau$ at most, resulting in a smaller synchronization error than in the conventional equivalent.

Figure 16:
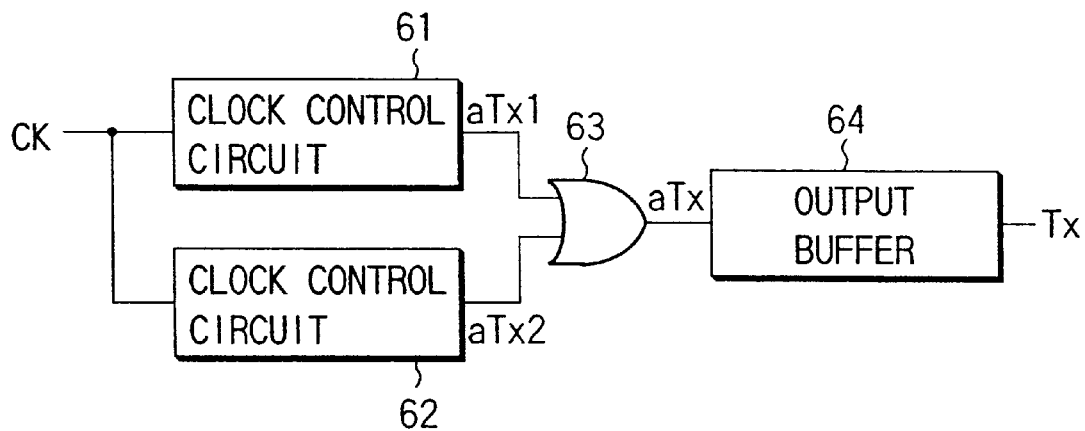
FIG. 16 is a block diagram of a clock signal generator circuit according to a second embodiment of the present invention.

FIG. 16 is a block diagram of a clock signal generator circuit according to a second embodiment of the present invention. The clock signal generator circuit comprises a clock control circuit 61 for taking in an external clock signal CK and outputting an internal clock signal aTx1, a clock control circuit 62 for taking in the external clock signal CK and outputting an internal clock signal aTx2, an OR circuit 63 to which both of the internal clock signals aTX1 and aTx2 are inputted, and an output buffer 64 to which the internal clock signal aTx outputted from the OR circuit 63 is inputted and outputs an internal clock signal Tx for controlling an off-chip driver.

One clock control circuit 61 outputs an internal clock signal aTx1 that synchronizes with the external clock signal CK and is caused to lead the external clock signal CK in phase by the total sum of the signal delay time in the OR circuit 63, the signal delay time in the output buffer 64, and the signal delay time in the off-chip driver.

The other clock control circuit 62 outputs an internal clock signal aTx2 that synchronizes with an internal clock signal 180° out-of-phase with the external clock signal CK and is caused to lead this internal clock signal in phase by the total sum of the signal delay time in the OR circuit 63, the signal delay time in the output buffer 64, and the signal delay time in the off-chip driver.

Figure 17:
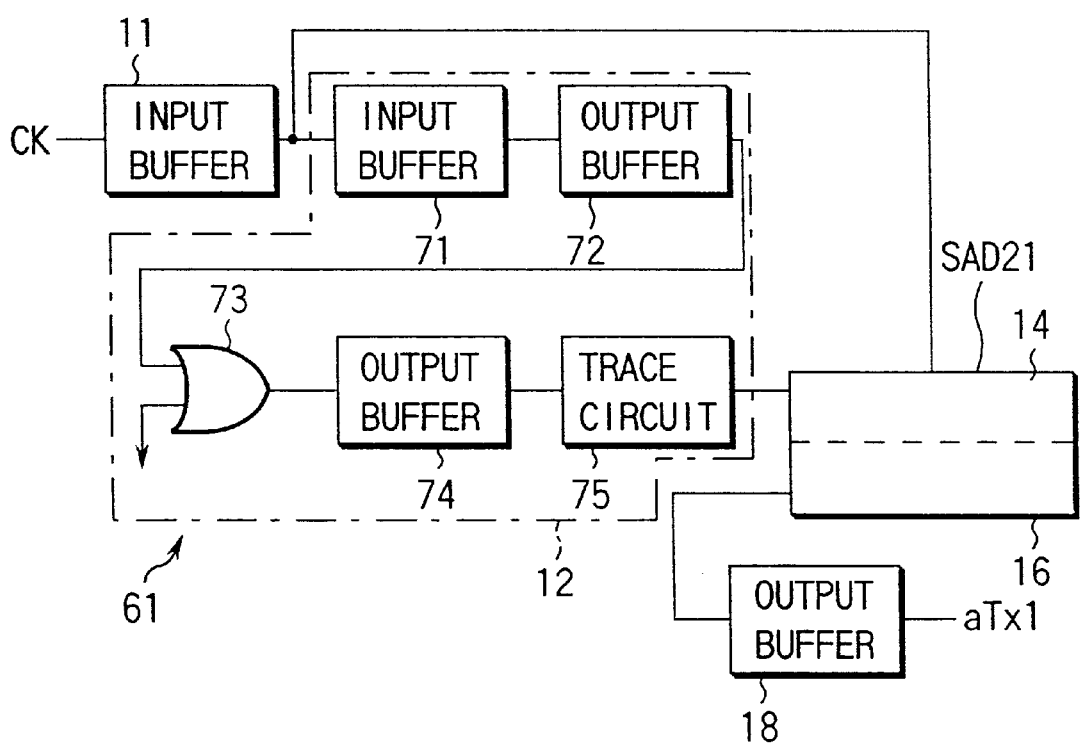
FIG. 17 shows a detailed configuration of a clock control circuit in FIG. 16.

FIG. 17 shows a detailed configuration of the clock control circuit 61 in FIG. 16. Like the clock control circuit of FIG. 4, the clock control circuit 61 is composed of an input buffer 11, a delay monitor circuit 12, a SAD circuit SAD21, and an output buffer 18. In the clock control circuit 61, the delay monitor circuit 12 is designed to have the amount of delay equal to the total sum of the sum of the signal delay time of the input buffer 11 and that of the output buffer 18, the amount of delay equivalent to the signal delay time of the OR circuit 63, the amount of delay equivalent to the signal delay time of the output buffer 64, and the amount of delay equivalent to the signal delay time of the off-chip driver.

Specifically, the delay monitor circuit 12 is composed of a cascade connection of the following circuits: an input buffer 71 equivalent in circuit configuration to the input buffer 11 in the clock control circuit 61, an output buffer 72 equivalent in circuit configuration to the output buffer 18 in the clock control circuit 61, an OR circuit 73 equivalent in circuit configuration to the OR circuit of FIG. 16 and grounded at one end, an output buffer 74 equivalent in circuit configuration to the output buffer 64 of FIG. 16, and a trace circuit 75 to which the internal clock signal Tx is supplied and which has not only a circuit configuration and circuit pattern equivalent to those of the off-chip driver (not shown) whose data output operation is controlled on the basis of the internal clock signal Tx but also virtually the same signal delay time as that of the off-chip driver.

The clock control circuit 61 basically outputs an internal clock signal aTx1 synchronizing with the external clock signal CK.

In the middle of the propagation route of the clock signal in the delay monitor circuit 12, the following circuits are inserted: an OR circuit 73 which has a circuit configuration equivalent to that of the OR circuit 63 in FIG. 16 and the amount of signal delay substantially equal to that of the OR circuit 63, an output buffer 74 which has a circuit configuration equivalent to that of the output buffer 64 and the amount of signal delay substantially equal to that of the output buffer 64, and a trace circuit 75 which has not only a circuit configuration and circuit pattern equivalent to those of the off-chip driver but also virtually the same signal delay time as that of the off-chip driver. This causes the input to the SAD circuit SAD21 to lag behind by the total sum of the delay times of the respective circuits. As a result, the internal clock signal aTx1 outputted from the output buffer 18 is caused to lead the external clock signal CK in phase by the sum of the signal delay time of the OR circuit 73, the signal delay time of the output buffer 74, and the signal delay time of the off-chip driver.

Figure 18:
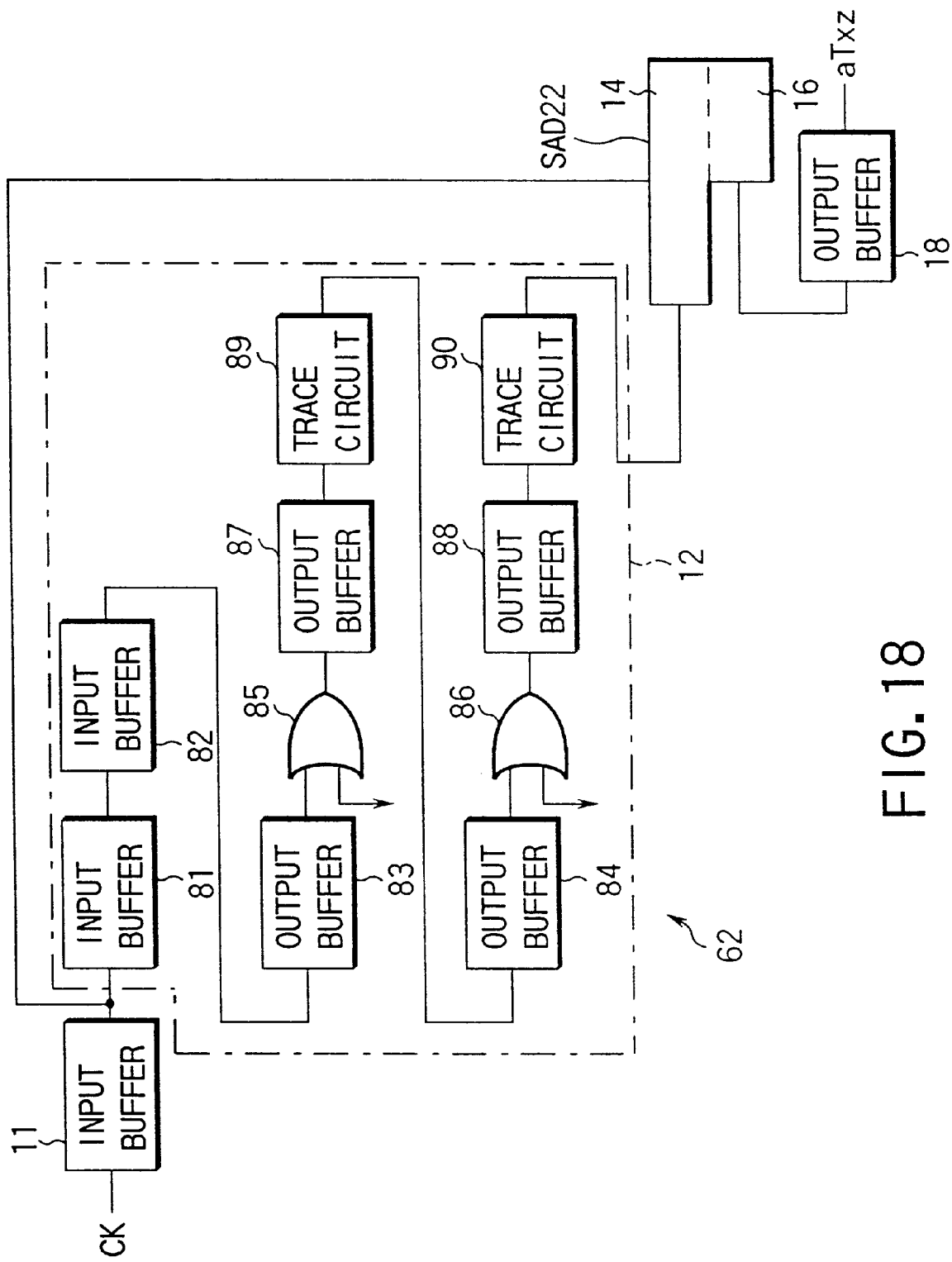
FIG. 18 shows a detailed configuration of another clock control circuit in FIG. 16.

FIG. 18 shows a detailed configuration of the clock control circuit 62 in FIG. 16. Like the clock control circuit of FIG. 4, the clock control circuit 62 is composed of an input buffer 11, a delay monitor circuit 12, a SAD circuit SAD22, and an output buffer 18. In the clock control circuit 62, the delay monitor circuit 12 is designed to have the amount of delay equal to the total sum of the amount of delay equivalent to twice the sum of the signal delay time of the input buffer 11 and that of the output buffer 18, the amount of delay equivalent to twice the signal delay time of the OR circuit 63, the amount of delay equivalent to twice the signal delay time of the output buffer 64, and the amount of delay equivalent to twice the signal delay time of the off-chip driver.

Specifically, the delay monitor circuit 12 is composed of a cascade connection of the following circuits: input buffers 81, 82 equivalent in circuit configuration to the input buffer 11 in the clock control circuit 62, output buffers 83, 84 equivalent in circuit configuration to the output buffer 18 in the clock control circuit 62, OR circuits 85, 86 equivalent in circuit configuration to the OR circuit 63 of FIG. 16 and grounded at one end, output buffers 87, 88 equivalent in circuit configuration to the output buffer 64 of FIG. 16, and trace circuits 89, 90 to each of which an internal clock signal Tx is supplied and which has not only a circuit configuration and circuit pattern equivalent to those of the off-chip driver (not shown) whose data output operation is controlled on the basis of the internal clock signal Tx but also virtually the same signal delay time as that of the off-chip driver.

The number of delay circuits in the backward delay array 16 of the SAD circuit SAD22 is halved.

As a result, the clock control circuit 62 basically outputs an internal clock signal 180° out-of-phase with the external clock signal CK. In the middle of the propagation route of the clock signal in the delay monitor circuit 12, the following circuits are inserted: two OR circuit 85, 86 which have a circuit configuration equivalent to that of the OR circuit 63 in FIG. 16 and the amount of signal delay substantially equal to that of the OR circuit 63, output buffers 87, 88 which have a circuit configuration equivalent to that of the output buffer 64 and the amount of signal delay substantially equal to that of the output buffer 64, and trace circuits 89, 90 which have not only a circuit configuration and circuit pattern equivalent to those of the off-chip driver but also virtually the same signal delay time as that of the off-chip driver. This causes the input to the SAD circuit SAD22 to lag behind by the total sum of the delay times of the respective circuits. As a result, the internal clock signal aTx2 outputted from the output buffer 18 is caused to lead a clock signal 180° out-of-phase with the external clock signal CK by the sum of the signal delay time of the OR circuit 63, the signal delay time of the output buffer 64, and the signal delay time of the off-chip driver.

After the internal clock signal aTx1 outputted from the clock control circuit 61 and the internal clock signal aTx2 outputted from the clock control circuit 62 have passed through the OR circuit 63, the phase of the internal clock signals aTx1 and aTx2 advanced beforehand by the signal delay time of the OR circuit 63 lags behind by that much, producing a clock signal aTx having twice the frequency of the external clock signal CK. The clock signal aTx further passes through the output buffer 64, causing the phase of the internal clock signal aTx advanced beforehand by the signal delay time of the output buffer 64 to lag behind by that much, which produces a clock signal Tx. As a result, the obtained internal clock signal Tx has twice the frequency of the external clock signal CK and is caused to lead the external clock signal CK by the signal delay time of the off-chip driver.

Specifically, when the data output operation of the off-chip driver is controlled using the clock signal Tx, the data output timing of the off-chip driver is synchronized with the external clock signal CK, which prevents the data output operation from lagging behind the external clock signal CK.

In the second embodiment, neither the internal clock signal Tu synchronizing with the external clock CK nor the internal clock signal Td 180° out-of-phase with the external clock signal CK is outputted. If both of the internal clock signals Tu and Td are needed, however, the clock control circuits shown in FIGS. 12 and 13 may be provided.

In addition, if neither the internal signal Tu nor Td is needed, the clock control circuits 41 and 42 are unnecessary and a total of two SAD circuits have only to be provided, which reduces the chip area and power consumption remarkably.

Figure 19:
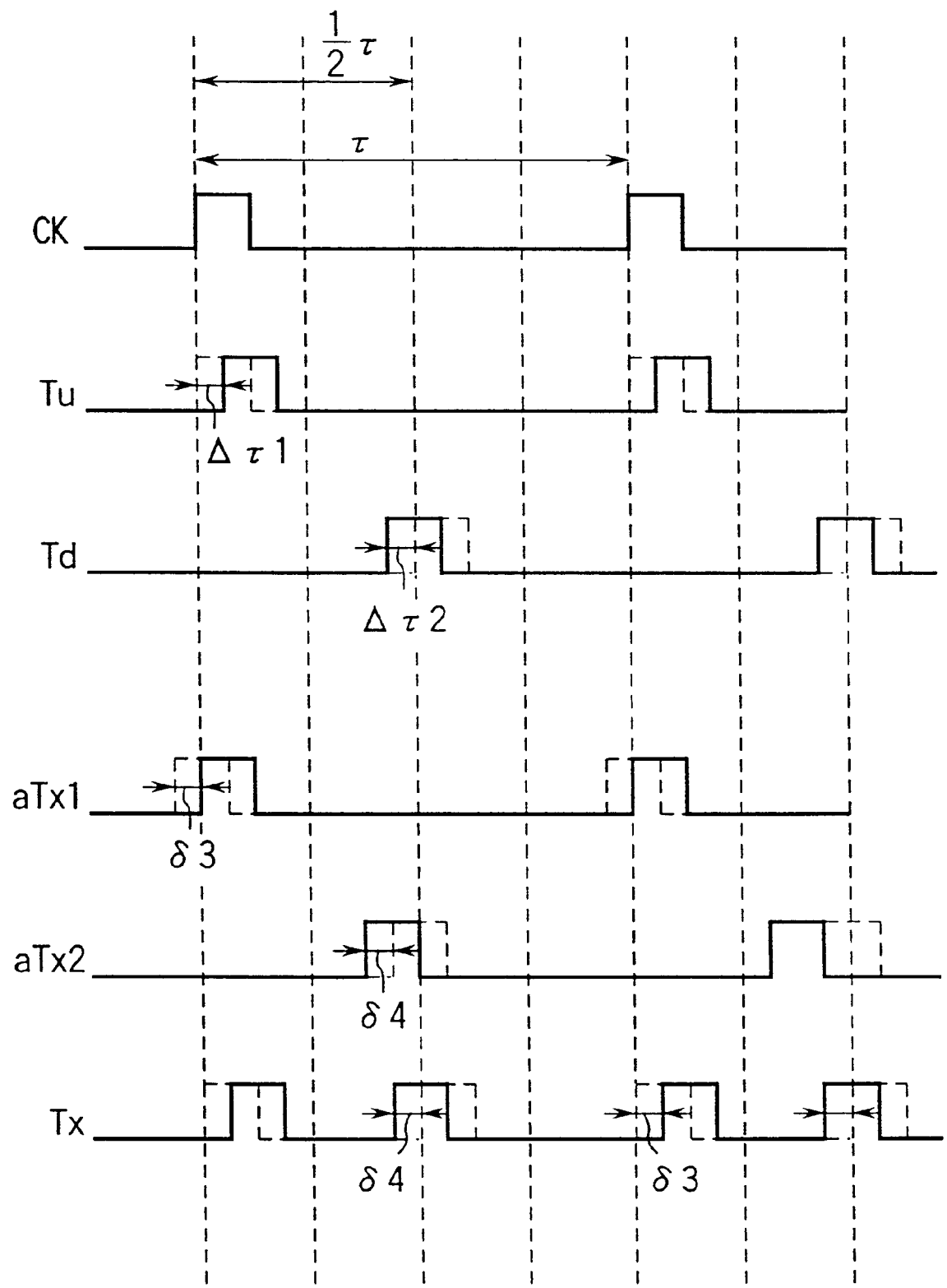
FIG. 19 is a timing chart to help explain an example of the operation of the clock signal generator circuit in FIG. 16.

FIG. 19 is a timing chart to explain an example of the operation of the clock signal generator circuit according to the second embodiment in a case where the clock control circuits 41, 42 that output the internal clock signals Tu and Td are provided. For example, it is assumed that the SAD circuit SAD11 in the clock control circuit 41 of FIG. 12 has a synchronization error of $\Delta\tau1$, the SAD circuit SAD12 in the clock control circuit 42 of FIG. 13 has a synchronization error of $\Delta\tau2$, the SAD circuit SAD21 in the clock control circuit 61 of FIG. 17 has a synchronization error of $\delta3$, and the SAD circuit SAD22 in the clock control circuit 62 of FIG. 18 has a synchronization error of $\delta4$. In this case, as shown in FIG. 19, the internal clock signal aTx1 has a synchronization error of $\delta3$ as compared with an ideal internal clock signal without a synchronization error shown by a broken line. Similarly, the internal clock signal aTx2 has a synchronization error of $\delta4$ as compared with an ideal internal clock signal without a synchronization error shown by a broken line. Thereafter, both of the internal clock signals atx1 and aTx2 are ORed by the OR circuit 63. Because the resulting signal does not pass through the SAD circuit, a synchronization error in the clock signal Tx is either $\delta3$ or $\delta4$ included originally in the clock signals aTx1 and aTx2.

For example, if a synchronization error in each SAD circuit is $\Delta\tau$ as in a conventional equivalent, a synchronization error included in the internal clock signal Tx is $\Delta\tau$ at most, resulting in a much smaller synchronization error than in the clock signal generator circuit of the first embodiment.

In the clock signal generator circuits in the first and second embodiments, explanation has been given about the case where the duty of the external clock signal CK is low as shown in the timing charts of FIGS. 15 and 19, or where the period of the low level is sufficiently short for the period of the high level. When the duty of the external clock signal CK becomes higher, there is a possibility that, when, for example, the OR circuit 45 in the clock signal generator circuit of the first embodiment of FIG. 11 ORs the internal clock signals aTx1 and aTx2, the high-level periods of both of the internal clock signals will overlap with each other.

To avoid this, a pulse-forming circuit may be provided at each input of the OR circuit 45, thereby shortening the high level period of each of the internal clock signals aTx1 and aTx2 and then causing the OR circuit 45 to OR them. When the pulse-forming circuit is provided, it is necessary to provide a circuit with the amount of signal delay equivalent to that of the pulse-forming circuit in the delay monitor circuit of each of the clock control circuits 43, 44 to match the signal delay times.

Explanation will be given about a concrete example of the trace circuit having the amount of signal delay equivalent to that of the off-chip driver that performs data output control using the internal clock signal Tx outputted from the clock signal generator circuit in each of the above embodiments and that of the off-chip driver used in the clock signal generator circuit in each of the embodiments.

Figure 20:
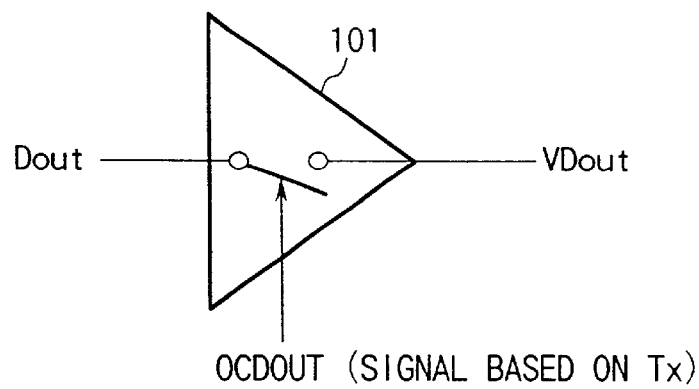
FIG. 20 is a block diagram showing a schematic configuration of an off-chip driver.

FIG. 20 is a block diagram showing a schematic configuration of an off-chip driver. When receiving data Dout generated at the preceding stage, an off-chip driver 101 outputs a voltage signal VDout corresponding to output data "1" or "0" to an output pad with such timing that, for example, output control signal OCDOUT goes high so that the voltage signal VDout may synchronize with the external clock signal. In a period during which the output control signal OCDOUT is low, the off-chip driver 101 does not output the voltage signal VDout corresponding to the output data to the output pad, which is disconnected from a power supply and has a high impedance.

The output control signal OCDOUT is a signal based on the internal clock signal Tx shown in FIG. 11 or FIG. 16.

Figure 21:
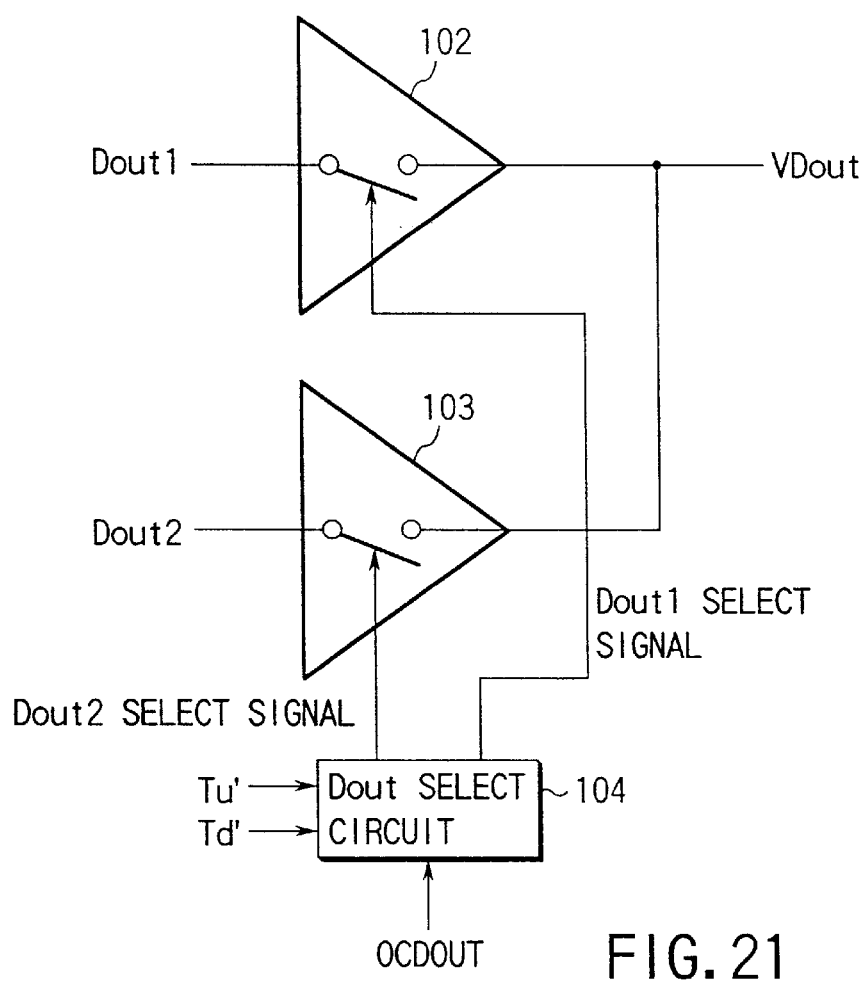
FIG. 21 is a block diagram showing a schematic configuration of a parallel-serial off-chip driver.

The I/O section particularly requiring a high-speed operation uses a method of causing the parallel-serial conversion of two bits in the internal data into one bit in the external data and outputting the resulting data. FIG. 21 is a block diagram showing a schematic configuration of the parallel-serial off-chip driver.

One data Dout1 generated at the preceding stage is inputted to an off-chip driver 102 and the other data Dout2 is inputted to an off-chip driver 103. The data output operation in the off-chip drivers 102, 103 are carried out by a Dout select circuit 104 to which the output control signal OCDOUT is inputted. The output nodes of the off-chip drivers 102, 103 are connected to each other.

Not only the output control signal OCDOUT but also the internal clock signals Tu', Td' based on the internal clock signals Tu, Td shown in FIGS. 11 and 16 are inputted to the Dout select circuit 104. Then, for example, one Dout1 select signal is outputted in synchronization with the internal clock signal Tu' and the other Dout2 select signal is outputted in synchronization with the internal clock signal Td'.

Figure 22:
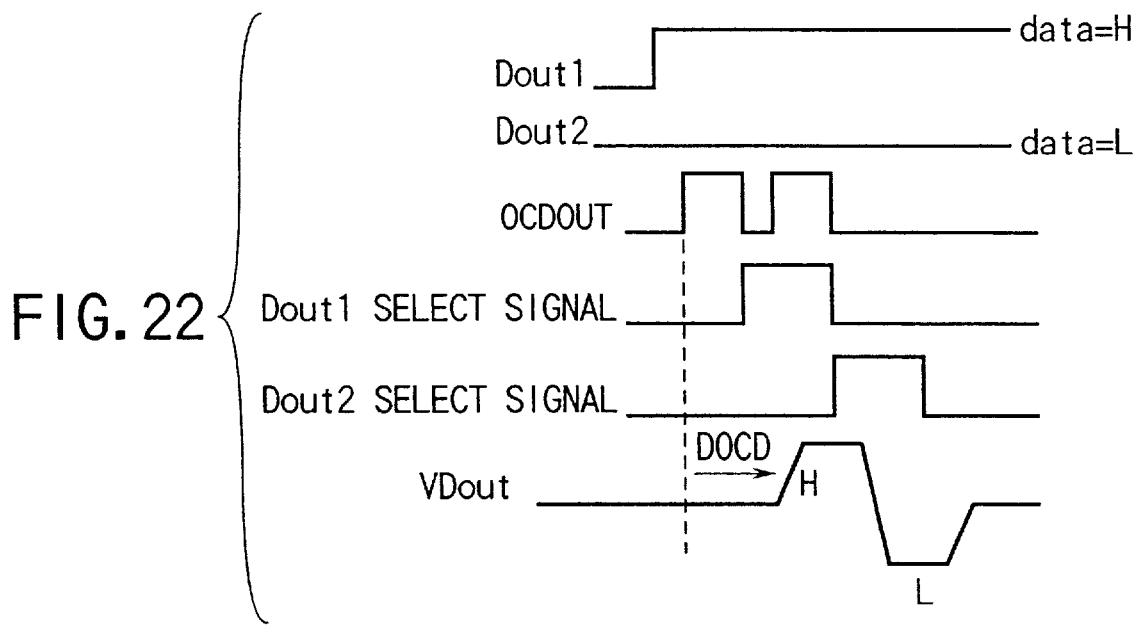
FIG. 22 is a timing chart to help explain an example of the operation of the off-chip driver in FIG. 21.

An example of the operation of an off-chip driver constructed as shown in FIG. 21 will be described by reference to the timing chart of FIG. 22. For example, it is assumed that high-level data is inputted as data Dout1 to one off-chip driver 102 and low-level data is inputted as data Dout2 to the other off-chip driver 103. After the output control signal OCDOUT has risen to the high level, the Dout select circuit 104 outputs a Dout1 select signal, selecting one off-chip driver 102, which outputs a voltage signal VDout according to data Dout1 to the output pad. As a result, the voltage signal VDout rises to the high level.

When the output control signal OCDOUT rises again to the high level after it has dropped to the low level, the Dout select circuit 104 outputs a Dout2 select signal this time. Then, the other off-chip driver 103 is selected, lowering the voltage signal VDout to the low level. Since a load capacitance is connected to the output pad, the low-level voltage signal VDout is charged through the load and eventually returns to the original state.

In this way, the select signal for the two off-chip drivers is activated sequentially according to the output control signal OCDOUT, which causes two-bit data to be outputted to the output pad sequentially.

In the circuit of FIG. 21, there is a specific delay time DOCD (e.g., about 1 ns) from when the output control signal OCDOUT goes to the high level until a signal is actually outputted to the output pad. To compensate for the delay time in the off-chip driver, the output control signal OCDOUT has to lead the external clock signal by DOCD.

In the clock signal generator circuits in the first and second embodiments, use of clock control circuits (e.g., the clock control circuits 41, 42, 43, 44 in FIGS. 12, 13, and 14) causes the internal clock signal Tx to lead the external clock signal CK by the delay time in the off-chip driver. To exactly reproduce the delay time equal to DOCD, each clock control circuit uses a trace circuit that has not only a circuit configuration and circuit pattern equivalent to those of the off-chip driver but also the amount of signal delay equivalent to that of the off-chip driver. When the characteristics of the off-chip driver have changed because of the influence of variations in the manufacturing process, the characteristics of the trace circuit change similarly. Therefore, it is desirable that the trace circuit should have a circuit configuration and circuit pattern equivalent to those of the off-chip driver.

However, when the circuit of FIG. 21 is used directly as the trace circuit, OCDOUT is inputted to the trace circuit, and VDout is used as the output of the trace circuit, the following problem arises. For example, in FIG. 21, consider a case where Dout1 is fixed to the high level, Dout2 is fixed to the low level, and Dout1 select signal is activated. When the Dout1 select signal has been activated and gone to the high level, the off-chip driver 102 is selected, bringing the voltage signal Vout to the high level. Then, when OCDOUT has gone to the low level and Vout has a high impedance, Vout remains at the high level, not dropping to the low level, which prevents the signal from being transferred to the next stage. Consequently, the circuit of FIG. 21 cannot be used as it is as the trace circuit.

Figure 23:
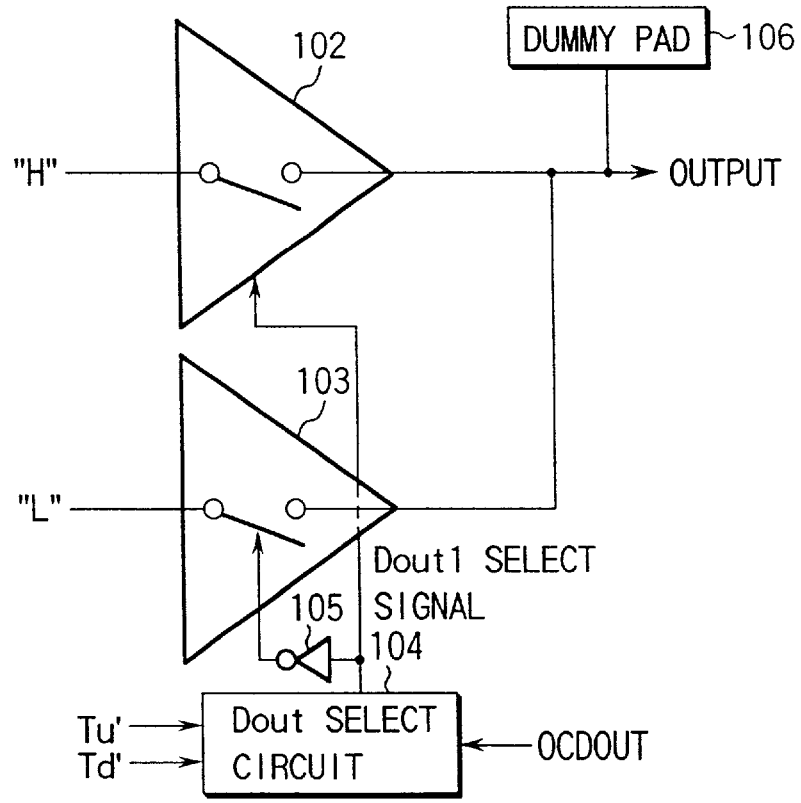
FIG. 23 is a circuit diagram of a trace circuit of a 2-bit parallel-serial off-chip driver used in the present invention.

To overcome this problem, a circuit having a configuration as shown in FIG. 23 is used as a trace circuit corresponding to a 2-bit parallel-serial off-chip driver. In the trace circuit of FIG. 23, two off-chip drivers 102, 103 and a Dout select circuit 104 are provided as in the trace circuit of FIG. 21. The trace circuit of FIG. 23 differs from that of FIG. 21 in that Dout1 select signal is inverted by an inverter 105 in place of using Dout2 select signal and the inverted signal is used to select the off-chip driver 103.

Figure 24:
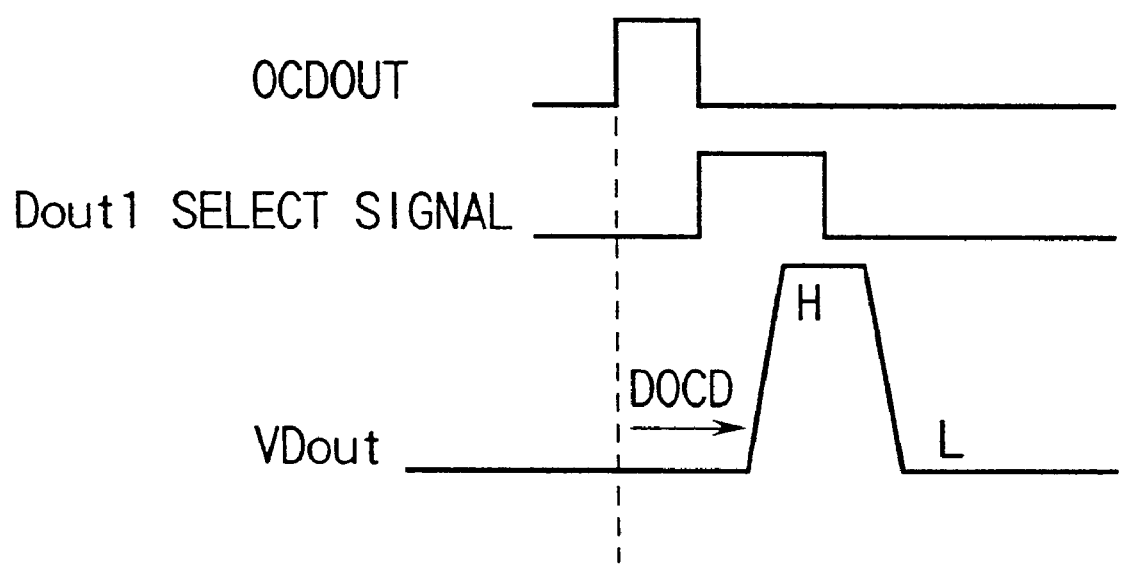
FIG. 24 is a timing chart to help explain an example of the operation of the trace circuit in FIG. 23.

As shown in the timing chart of FIG. 24, with the trace circuit constructed as described above, Dout1 select signal is activated after the output control signal OCDOUT has risen to the high level, selecting the off-chip driver 102, which brings the voltage signal VDout to the high level. Then, when the output control signal OCDOUT has gone to the low level, Dout1 select signal is deactivated, canceling the selected state of the off-chip driver 102. The deactivation of Dout1 select signal brings the output of the inverter 105 to the high level, selecting the off-chip driver 103, which causes the voltage signal VDout to the low level. Consequently, with such a circuit, when a clock signal is inputted as output control signal OCDOUT, a voltage signal VDout corresponding to the clock signal lagging behind by the delay time DOCD and the delay time from the output control signal OCDOUT to the voltage signal VDout is equal to that of the actual off-chip driver.

The signal for selecting the off-chip driver 103 lags behind by the signal delay time of the inverter 105. Because this signal is used to determine the rising of the voltage signal VDout, a delay in the signal would have no effect on the rising of the voltage signal VDout.

In the actual off-chip driver, a specific pattern has been formed on the node at which the voltage signal VDout is outputted. The pad acts as a load against the voltage signal VDout. Thus, to adjust the signal delay time of the trace circuit exactly to the actual off-chip driver, a dummy pad 106 with the same pattern as that of the actual pad has only to be provided on the node of the voltage signal VDout of the trace circuit.

In the off-chip driver, it is desirable that the delay time in outputting high-level data should be equal that in outputting low-level data. In the actual off-chip driver, however, they might differ.

Figure 25:
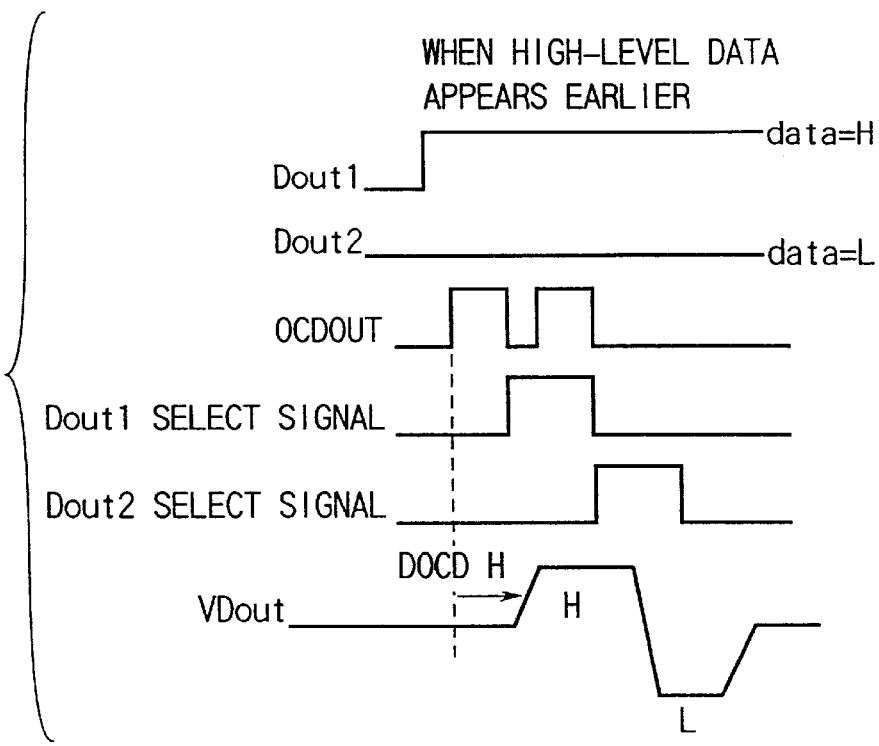
FIG. 25 is a timing chart to help explain an example of the operation of the off-chip driver in FIG. 21.

FIG. 25 is a timing chart in a case where the delay time is short in outputting high-level data in the 2-bit parallel-serial off-chip driver of FIG. 21. In this case, the input data Dout1 to the off-chip driver 102 is fixed to the high level and the input data Dout2 to the other off-chip driver 103 is fixed to the low level. As shown in the figure, when the off-chip driver 102 is selected and the voltage signal VDout rises to the high level, the delay time DOCDH is short.

Figure 26:
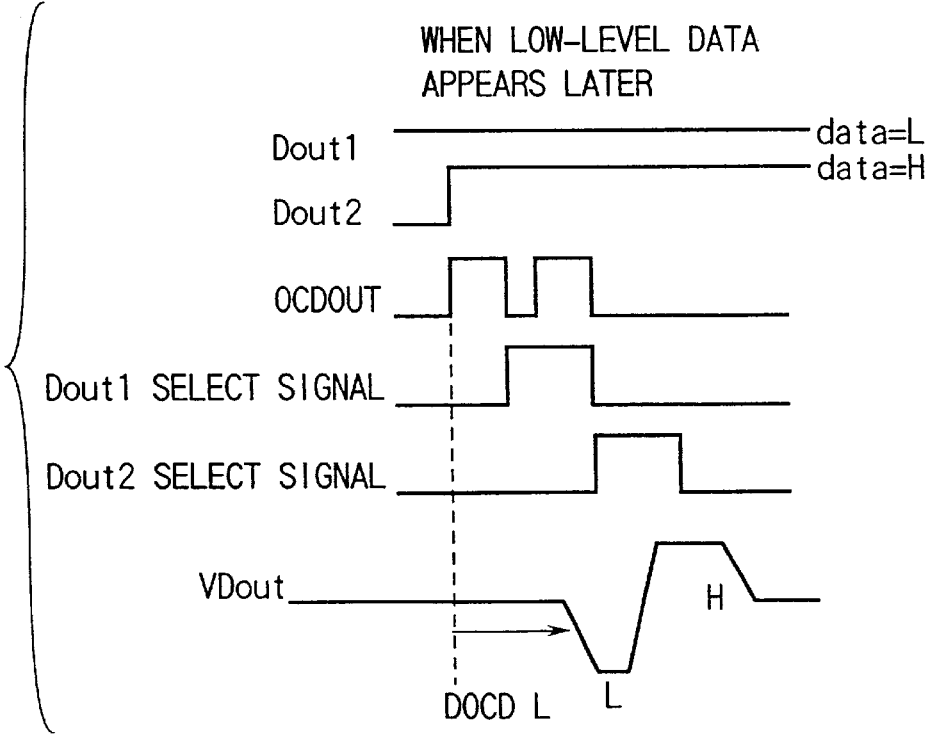
FIG. 26 is a timing chart to help explain another example of the operation of the off-chip driver in FIG. 21.

In contrast, FIG. 26 is a timing chart in a case where the delay time is long in outputting low-level data. In this case, the input data Dout1 to the off-chip driver 102 is fixed to the low level and the input data Dout2 to the other off-chip driver 103 is fixed to the high level. As shown in the figure, when the off-chip driver 102 is selected and the voltage signal VDout drops to the low level, the delay time DOCDH is long.

The difference between the delay times results from the difference of circuit scheme, that is, from a case where, of p- and n-channel MOS transistors constituting an off-chip driver, the channel width of a p-channel MOS transistor that outputs a high-level signal is made sufficiently greater than that of an n-channel MOS transistor that outputs a low-level signal, or from variations in the manufacturing process.

In this case, as shown in FIG. 21, with the trace circuit where the input data Dout1 is fixed to the high level and the input data Dout2 is fixed to the low level, when the input clock signal rises to the high level and its output clock signal rises to the high level, the delay time can be reproduced exactly. However, the delay time in the output data in the off-chip driver dropping to the low level cannot be reproduced exactly, resulting in a large error.

To overcome this problem, both the signal delay time in the output data of the off-chip driver going to the high level and that in the output data going to the low level are compensated for, thereby causing the output data to be outputted in synchronization with the external clock signal.

Hereinafter, a third embodiment of the present invention will be explained.

Figure 27:
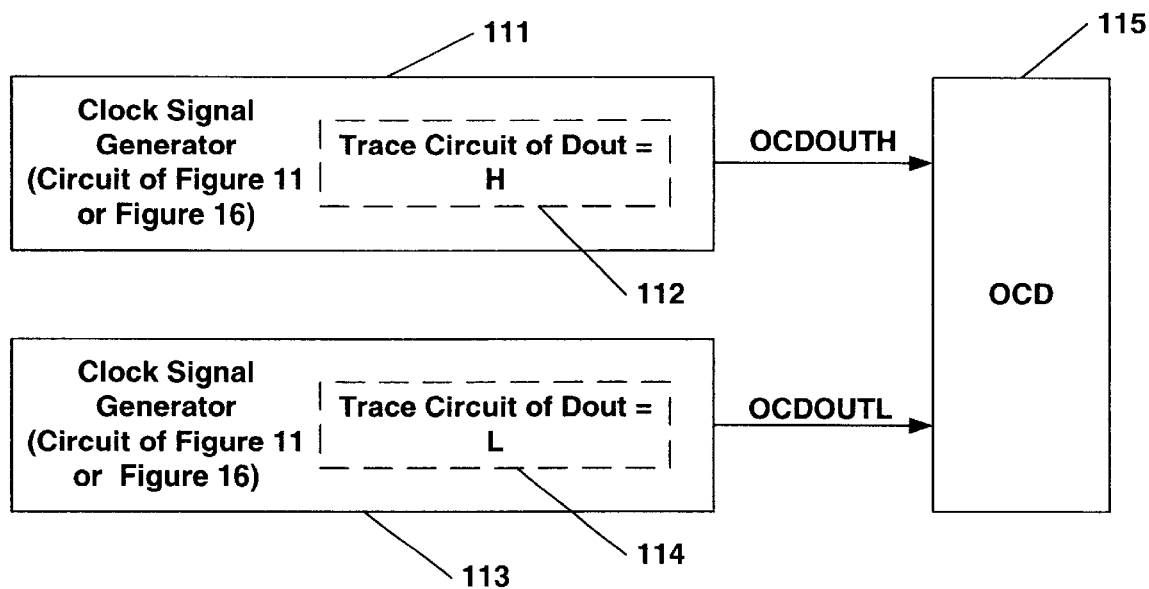
FIG. 27 is a block diagram of a clock signal generator circuit according to a third embodiment of the present invention.

FIG. 27 is a block diagram of a clock signal generator circuit according to the third embodiment of the present invention. In FIG. 27, numeral 111 indicates a clock signal generator circuit which has a similar configuration to, for example, that of the clock signal generator circuit according to the first embodiment of FIG. 11 or the second embodiment of FIG. 16 and which includes a trace circuit 112 having not only a similar configuration to that of the trace circuit of FIG. 14 or FIG. 17 or to that of the trace circuits (89, 80) of FIG. 18 but also a signal delay time equivalent to the signal delay time in an off-chip driver outputting high-level data.

In addition, numeral 113 indicates a clock signal generator circuit which has a similar configuration to, for example, that of the clock signal generator circuit according to the first embodiment of FIG. 11 or the second embodiment of FIG. 16 and which includes a trace circuit 114 having not only a similar configuration to that of the trace circuit of FIG. 14 or FIG. 17 or to that of the trace circuits (89, 80) of FIG. 18 but also a signal delay time equivalent to the signal delay time in the off-chip driver outputting low-level data.

The control signal OCDOUTH outputted from one clock signal generator circuit 111 and the control signal OCDOUTL outputted from the other clock signal generator circuit 113 are inputted to an off-chip driver (OCD) 115.

Figure 28:
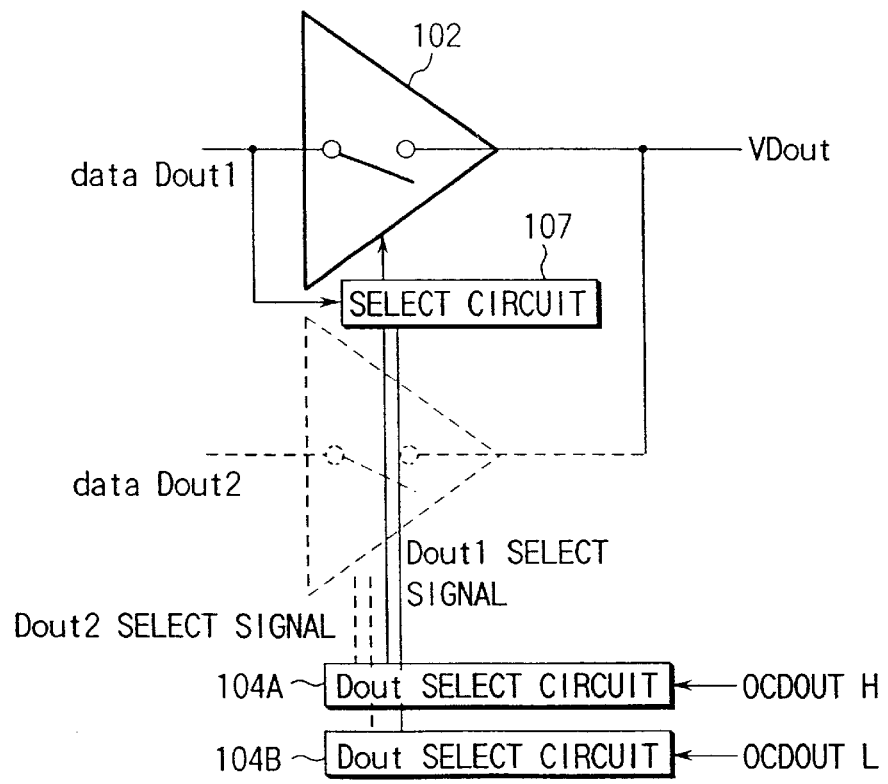
FIG. 28 is a block diagram of an off-chip driver controlled by the control signal generated at the control signal generator circuit of FIG. 27.

FIG. 28 is a block diagram showing a concrete configuration of the off-chip driver 115. The off-chip driver 115 is provided with the following circuits acting as what corresponds to the Dout select circuit 104: a Dout select circuit 104A to which the control signal OCDOUTH is inputted and outputs a Dout1 select signal and a Dout2 select signal according to the control signal OCDOUTH and a Dout select circuit 104B to which the control signal OCDOUTL is inputted and outputs a Dout1 select signal and a Dout2 select signal according to the control signal OCDOUTL.

The select signals in two routes outputted from the Dout select circuits 104A and 104B are inputted to a select circuit 107 provided for each of the off-chip drivers (only the off-chip driver 102 is shown). The select circuit 107 senses the level of data Dout1 to the off-chip driver 102, selects the select signal from either the Dout select circuit 104A or 104B according to the sensed level.

When the off-chip driver 102 outputs high-level data Dout1, the select circuit 107 selects the select signal from the Dout select circuit 104A and inputs it to the off-chip driver 102. On the other hand, when the off-chip driver 102 outputs low-level data Dout1, the select circuit 107 selects the select signal from the Dout select circuit 104B and inputs it to the off-chip driver 102.

Therefore, with the third embodiment, even in the off-chip drivers differing in the delay time from when the select signal is selected until the data is outputted in selecting high-level data or low-level data, since the selection of the drivers is controlled using the output select signals advanced by the respective delay times, they can output data in synchronization with the external clock signal all the time.

The present invention is not restricted to the above embodiments and may be practiced or embodied in still other ways without departing from the spirit or essential character thereof. For instance, while in the embodiments, the internal clock signal Tx synchronizing with the external clock signal CK has been outputted, the internal clock signal Tx may be produced from an internal clock signal outputted from another clock control circuit provided in the chip, in place of the external clock signal CK. Alternatively, the internal clock signal Tx may be produced from an asynchronous clock signal not outputted from another clock control circuit in the chip.

In the third embodiment of FIG. 27, the clock signal generator circuits 111, 113 for generating one and the other control signals have a similar configuration to, for example, that of the clock signal generator circuit according to the first embodiment of FIG. 11 or the second embodiment of FIG. 16. The present invention is not restricted to this. The clock signal generator circuits 111, 113 may have any circuit configuration, provided that the configuration can compensate for the signal delay time in the off-chip driver outputting high-level data or low-level data.

As described above, the clock signal generator circuit in each of the first to third embodiments can reduce synchronization errors more without using a PLL circuit or a DLL circuit than a conventional equivalent.

Hereinafter, a clock signal generator circuit according to a fourth embodiment of the present invention will be explained. A clock signal generator circuit shown in FIG. 29 comprises a first clock control circuit 121, a second clock control circuit 122, and a control circuit 123 provided between the clock control circuits 121, 122. These circuits are integrated into, for example, the same chip.

The first clock control circuit 121 outputs a clock signal T1 in synchronization with an input clock signal. The clock control circuit 121 also outputs at least one asynchronous pulse signal until synchronization is established. Of the pulse signals outputted from the first clock control circuit 121, the control circuit 123 cuts off the pulse signals not synchronizing with the input clock signal and sequentially outputs a group of the first and subsequent synchronous pulse signals as a clock signal T2. The second clock control circuit 122 outputs a clock signal in synchronization with the clock signal T2. The output clock signal from the second clock control circuit 122 is inputted to another clock control circuit or another circuit. In this case, the input clock signal may be the external clock signal CK or an internal clock signal outputted from the clock control circuit in the chip.

In the clock signal generator circuit of the fourth embodiment, because only the clock signal synchronized with the external clock CK at the first clock control circuit 121 is supplied to the second clock control circuit 122, the second clock control circuit 122 need not be operated earlier than the time a synchronizing clock signal is needed. As a result, the clock control circuit 122 need not be operated during the time when a synchronizing signal is not necessary, which prevents the standby power of the entire chip from increasing.

Figure 29:
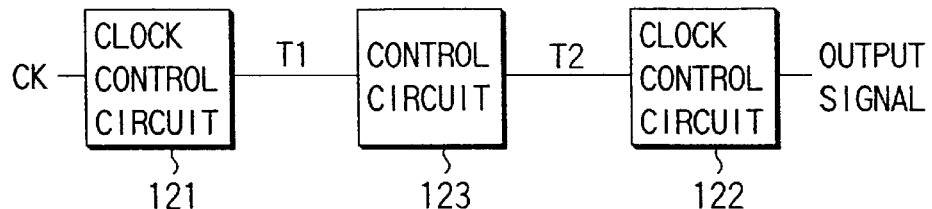
FIG. 29 is a block diagram of a clock signal generator circuit according to a fourth embodiment of the present invention.

In FIG. 29, the two clock control circuits 121, 122 have been provided and the control circuit 123 for cutting off an asynchronous pulse signal has been provided between them. In a case where a clock signal generator circuit is composed of two or more clock control circuits connected in series, a control circuit for cutting off an asynchronous pulse signal has only to be provided between the clock control circuits.

Figure 30:
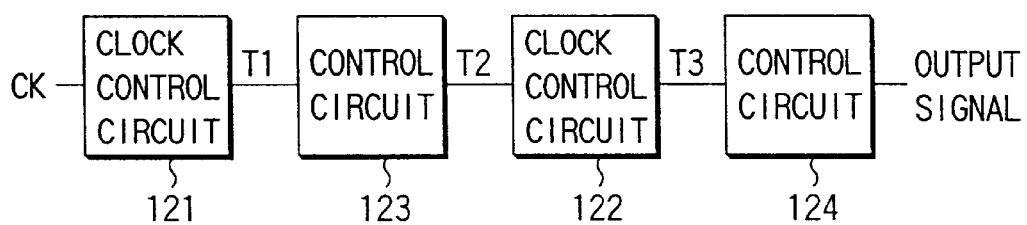
FIG. 30 is a block diagram of a clock signal generator circuit according to a fifth embodiment of the present invention.

FIG. 30 is a block diagram of a clock signal generator circuit according to a fifth embodiment of the present invention. In the embodiment of FIG. 29, the output of the clock control circuit 122 has been inputted directly to another clock control circuit. When a direct input of the output from the clock control circuit is not desirable, a control circuit 124 for cutting off an asynchronous pulse signal may be provided on the output side of the clock control circuit 122 as shown in FIG. 30.

Figure 31A:
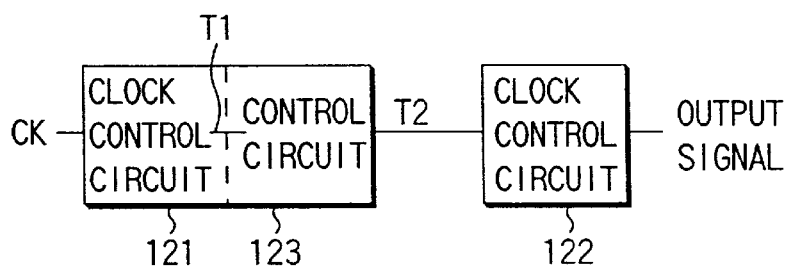
FIGS. 31A and 31B are block diagrams of a clock signal generator circuit according to a sixth embodiment of the present invention.
Figure 31B:
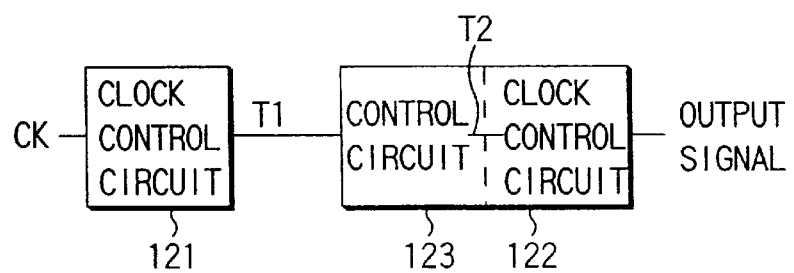

FIGS. 31A and 31B are block diagrams of a clock signal generator circuit according to a sixth embodiment of the present invention. In the embodiment of FIG. 29, the control signal for cutting off an asynchronous pulse signal has been provided separately from the clock control circuit. In FIG. 31A, a control circuit is included in the clock control circuit 121. Specifically, a control circuit 123 for cutting off an asynchronous pulse signal is provided in the output section of the clock control circuit 121. Contrary to the case of FIG. 31A, a control circuit may be included in the clock control circuit 122 to which the clock signal T2 is inputted. Specifically, the control circuit 123 for cutting off an asynchronous pulse signal may be provided in the input section of the clock control circuit 122. FIG. 31B shows a configuration where a control circuit is included in the clock control circuit 122 in such a manner that the control circuit 123 for cutting off an asynchronous pulse signal is provided in the input section of the clock control circuit 122.

In the fourth to sixth embodiments, a SAD type clock control circuit may be used as each of the first and second clock control circuits 121, 122. Alternatively, in place of the SAD type clock control circuit, another type of clock control circuit, such as a PLL circuit or a DLL circuit, may be used.

The control circuits 123, 124 used in the fourth to sixth embodiments require the function of cutting off asynchronous pulse signals and permitting only synchronous pulse signals to pass through. When the number of asynchronous pulse signals varies with the operating frequency or operating voltage or when the number of asynchronous pulse signals differs because of the difference of circuit scheme, the control circuits 123, 124 are required to set the number of pulses to be cut off.

Figure 32:
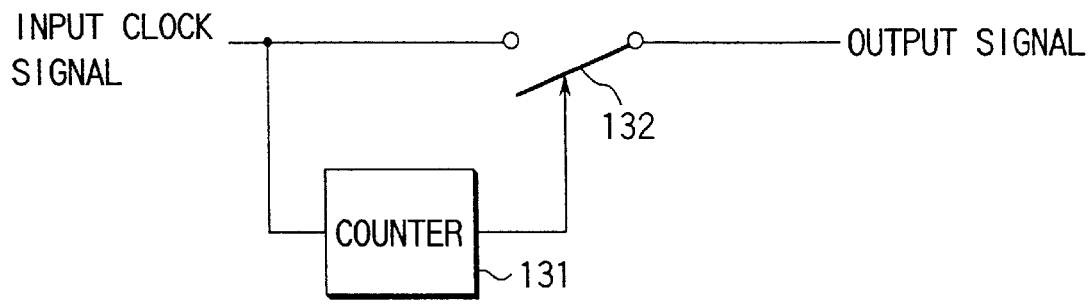
FIG. 32 is a circuit diagram showing a concrete configuration of the control circuit used in the respective clock signal generator circuits in FIGS. 29 to 31.

FIG. 32 shows a concrete configuration of the control circuits 123, 124 used in a case where only one asynchronous pulse signal occurs before a group of synchronous clock signals appear. Each of the control circuits 123, 124 is composed of a counter 131 for counting input clock signals and a switch circuit 132 inserted between the input clock signal path and output clock signal path.

When the counter 131 counts one pulse signal coming from the input clock signal path, the output of the counter 131 closes the switch circuit 132.

Therefore, the control circuit of FIG. 32 does not output a pulse signal not synchronized with the input clock signal and inputs a group of the second pulse synchronized with the input clock signal and subsequent pulse signals, as a clock signal to the clock control circuit 122.

Figure 33:
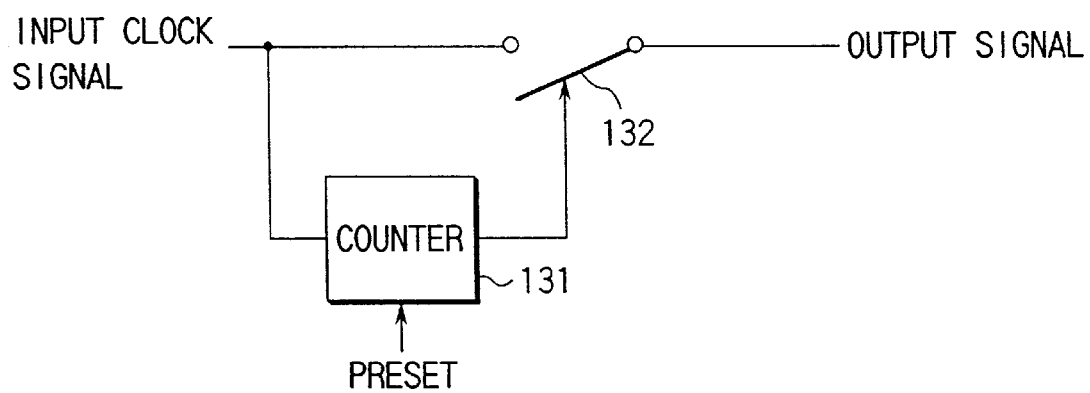
FIG. 33 is a circuit diagram showing another concrete configuration of the control circuit used in the respective clock signal generator circuits in FIGS. 29 to 31.

FIG. 33 shows a concrete configuration of each of the control circuits 123, 124 suitable for a case where the number of asynchronous pulse signals outputted from the clock control circuit varies. In this case, each of the control circuits 123, 124 differs from that of FIG. 32 in that a preset counter capable of setting a count value is used as a counter 131. In the other respects, the former is the same as the latter.

In this case, when the counter 131 has counted as many pulse signals coming from the input clock signal path as equal the preset number, the output of the counter 131 closes the switch circuit 132.

Therefore, the control circuit of FIG. 33 does not output a pulse signal not synchronized with the input clock signal and inputs a group of synchronous pulse signals after as many pulse signals as equal the present number, as a clock signal to the clock control circuit 122.

Figure 34:
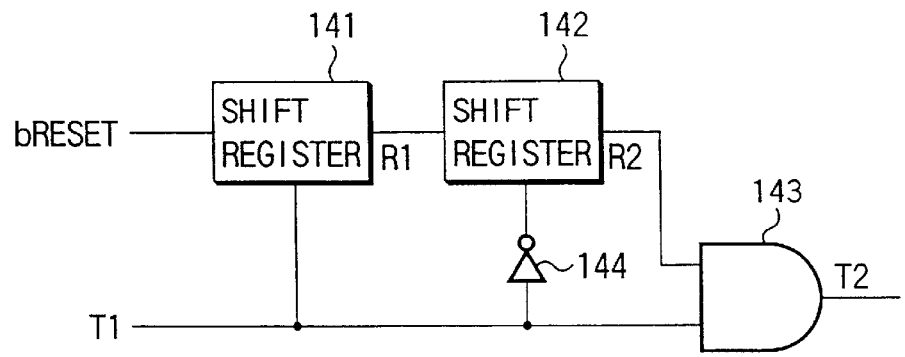
FIG. 34 is a circuit diagram showing still another concrete configuration of the control circuit used in the respective clock signal generator circuits in FIGS. 29 to 31.

FIG. 34 shows a concrete configuration of each of the control circuits 123, 124 used in a clock control circuit that generates only one asynchronous pulse signal before a group of synchronous clock signals.

Each of the control signals 123, 124 is composed of two shift registers 141, 142 and a 2-input AND gate 143, and an inverter 144. A reset signal bRESET is inputted to the data input terminal of one shift register 141. To the data output terminal of one shift register 141, the data input terminal of the other shift register 142 is connected. The signal at the data output terminal of the other shift register 142, together with the input clock signal T1 to the control circuit, is inputted to the AND gate 143. The clock signal T1 is also inputted as a shift control signal to one shift register 141. The clock signal T1 is also inputted as a shift control signal to the other shift register 142 via the inverter 144.

An example of the operation of the control circuit in FIG. 34 will be described by reference to a timing chart in FIG. 35.

Figure 35:
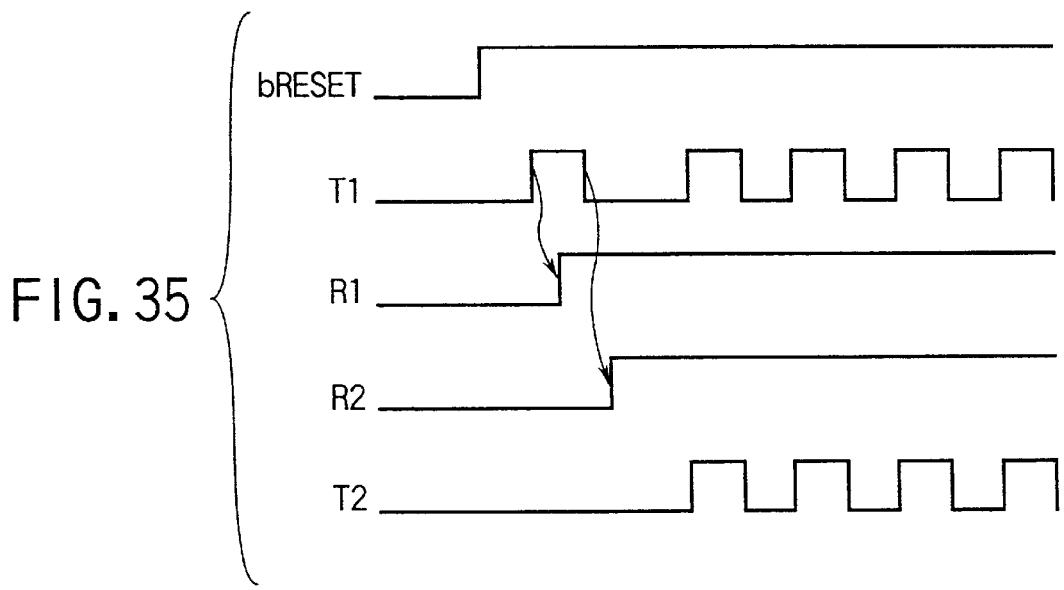
FIG. 35 is a timing chart to help explain an example of the operation of the control circuit in FIG. 34.

It is assumed that, after the reset signal bRESET has gone to the high level, canceling the reset state, the clock signal T1 is inputted with the timing as shown in FIG. 35. At this time, a first pulse signal in the clock signal T1 is assumed to be a pulse signal not synchronized with the input clock signal. Then, after the first pulse signal in the clock signal T1 has risen to the high level, one shift register 141 takes in the reset signal bRESET of the high level, with the result that the output R1 of the shift register 141 changes from the low level to the high level.

Next, after the first pulse signal in the clock signal T1 has changed from the high level to the low level, changing the output of the inverter 144 from the low level to the high level, the high output R1 of one shift register 141 is loaded into the other shift register 142, with the result that the output R2 changes from the low level to the high level. Because the AND gate 143 outputs the input clock signal T1 in the high-level period of R2, it does not output the first pulse signal in the input clock signal T1.

As a result, the clock signal T2 lies in a group of pulse signals after the second and later pulses synchronized with the input clock pulse.

The control circuit using the shift register of FIG. 34 has cut off only the first pulse not synchronized with the input clock signal. To cut off consecutive pulse signals, the number of shift registers has only to be increased.

Figure 36:
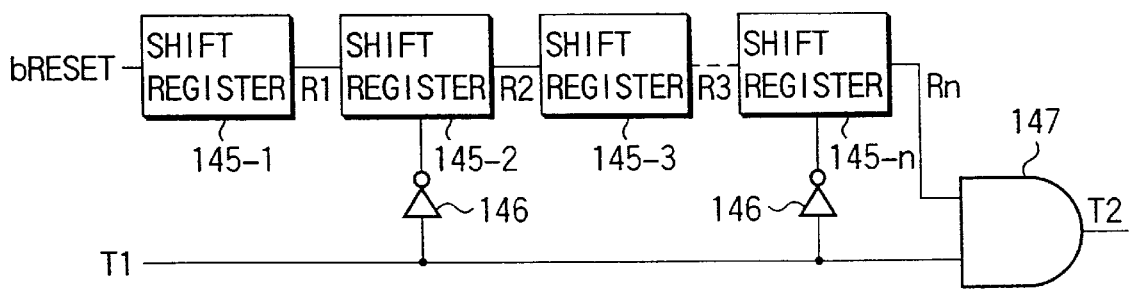
FIG. 36 is a circuit diagram showing still another concrete configuration of the control circuit used in the respective clock signal generator circuits in FIGS. 29 to 31.

Specifically, FIG. 36 shows a concrete configuration of a control circuit for cutting off consecutive pulse signals. The control circuit is constructed as follows. Two or more shift registers 145-1 to 145-n are connected in series. A reset signal bRESET is inputted to the data input terminal of the shift register 145-1 at the first stage. A clock signal T1 is inputted as a shift control signal to the respective odd-numbered shift registers 145-1, 145-3, . . . The clock signal T1 is inputted via corresponding inverters 146 as a shift control signal to the respective even-numbered shift registers 145-2, . . . , 145-n. The signal at the data output terminal of the shift register 145-n at the final stage, together with the clock signal T1, is inputted to an AND gate 147.

The control circuit of FIG. 36 can cut off as many consecutive input pulse signals as equal half the number of shift registers 145-1 to 145-n.

In the fourth to sixth embodiments, a control circuit for cutting off an asynchronous pulse signal is provided between the clock control circuits or in the output section or input section of the clock control circuit, thereby preventing the asynchronous pulse signal from being inputted to the clock control circuit at the next stage. Next, an embodiment where a clock control circuit itself is provided with the function of preventing an asynchronous pulse signal from being outputted will be explained.

Figure 1:
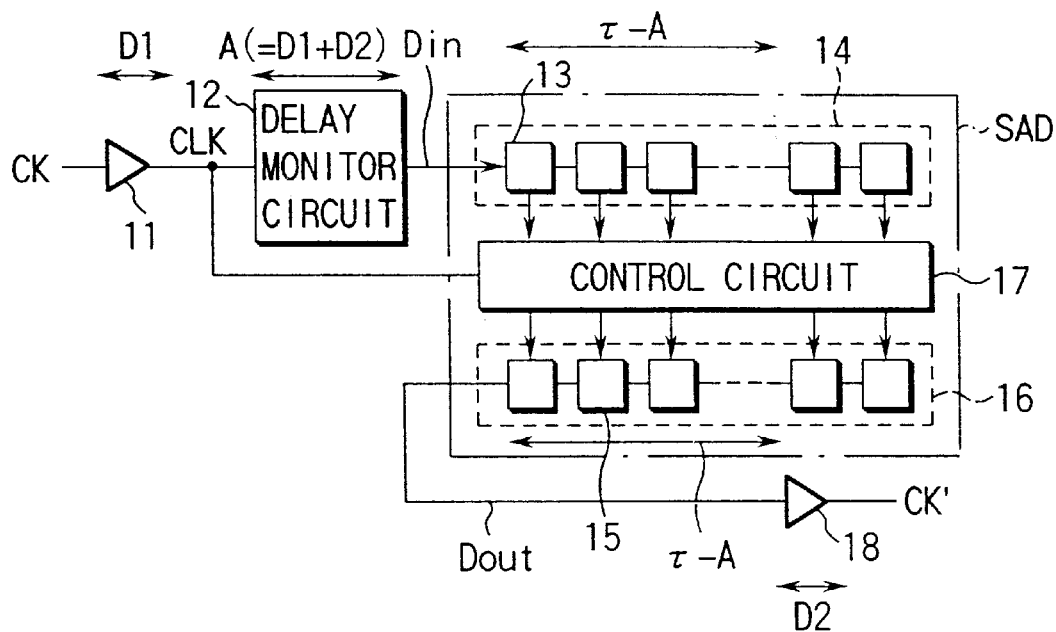
FIG. 1 is a block diagram of a conventional SAD type clock control circuit.
Figure 2:
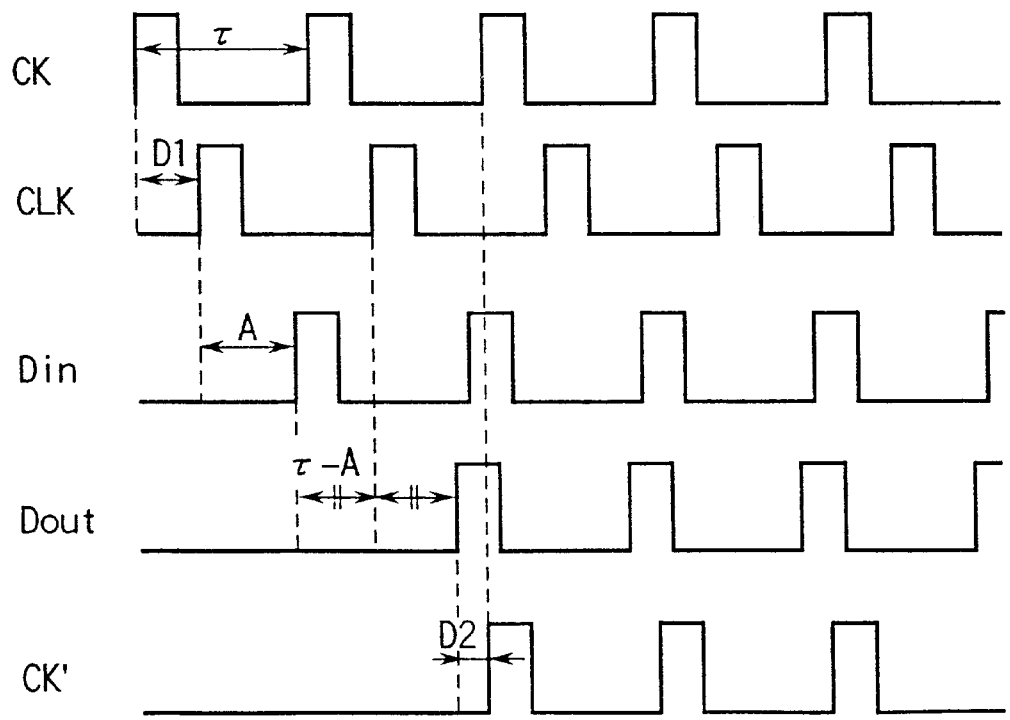
FIG. 2 is a timing chart to help explain an example of the operation of the clock control circuit of FIG. 1.
Figure 3:
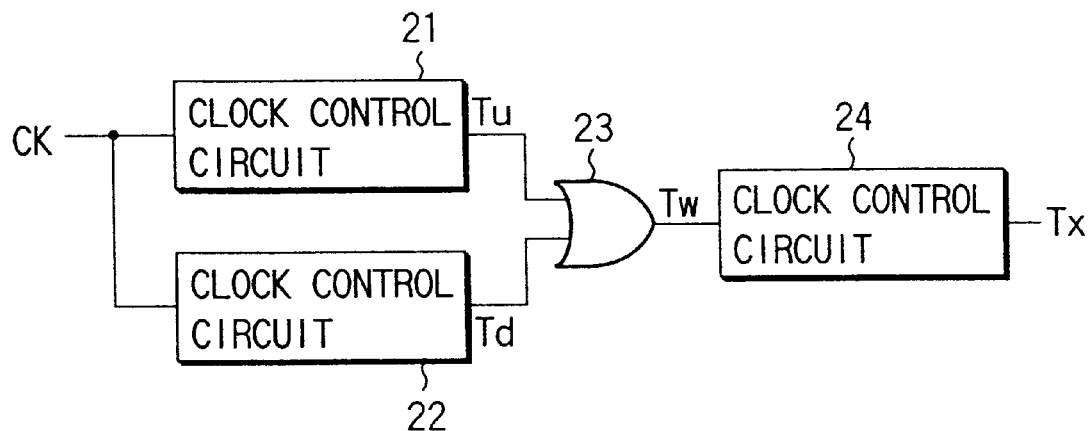
FIG. 3 is a block diagram of a conventional clock signal generator circuit using the clock control circuit of FIG. 1.

In the SAD type clock control circuit of FIG. 1, the output from the delay monitor circuit 12 after the input of the clock signal CLK is delayed by the forward delay array 14 for a specific time. After the next clock signal CLK has arrived, the next clock signal CLK is delayed by the backward delay array 16 for the time corresponding to the delay time of the forward delay array 14.

Figures 37, 38:
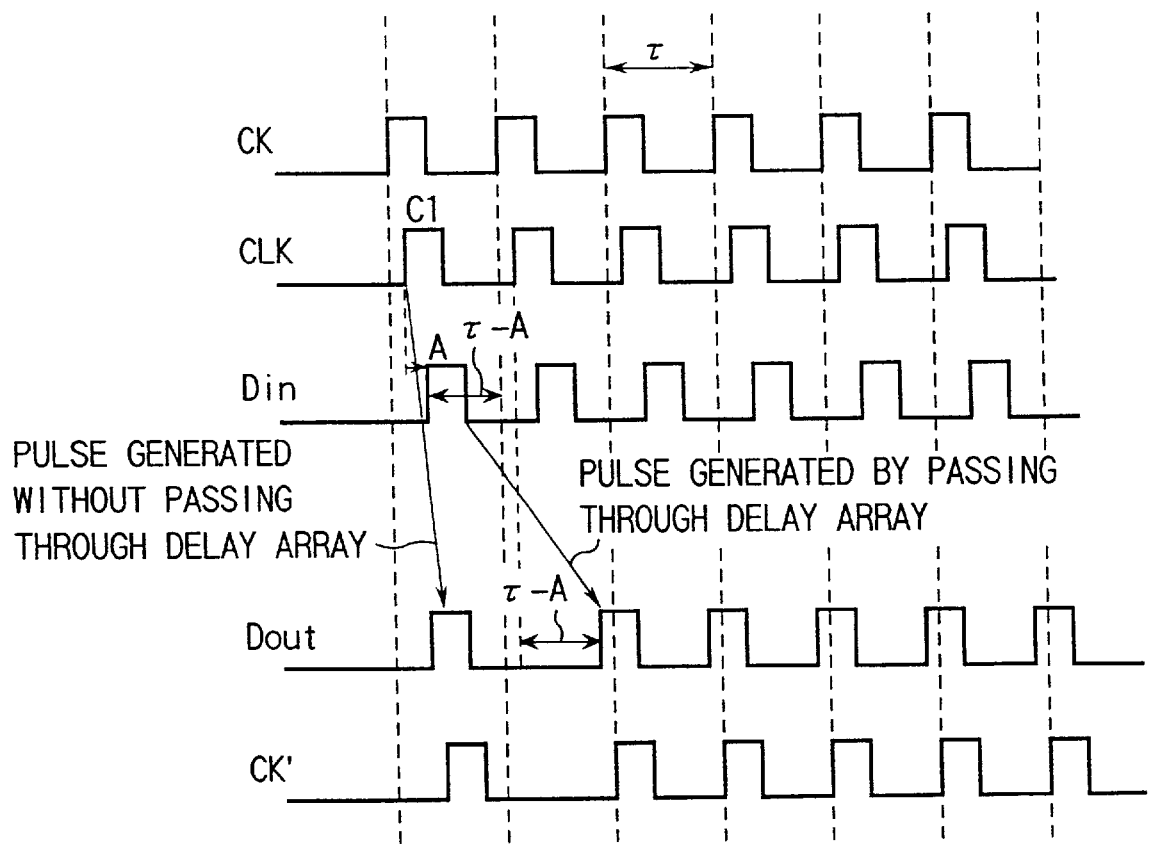
FIG. 37 is a table to help explain the logical operation of the delay circuits in the backward delay array used in the clock signal generator circuit in each of FIGS. 29 to 31.
FIG. 38 is a timing chart to help explain an example of the operation of a clock control circuit including a SAD circuit.

To realize such an operation, each of the delay circuits in the backward delay array 16 performs logical operation as shown in FIG. 37. Each of the delay circuits 15 in the backward delay array 16 permits a pulse from a subsequent stage to pass through, makes the output high, or makes the output low, depending on the state of the control circuit 17 and the value of the CLK line to which the clock signal CLK is transmitted. Specifically, when the state of the control signal 17 is in the set state, each of the delay circuits 15 propagates the output pulse signal from the preceding stage to the subsequent stage, regardless of the value of the CLK line. On the other hand, with the control circuit 17 in the reset state, when the value of the CLK line is at the high level, the corresponding delay circuit 15 makes the output high; and when the value of the CLK line is at the low level, the corresponding delay circuit 15 makes the output low.

In the conventional SAD circuit, the delay circuit 15 in the backward delay array 16 corresponding to the delay circuit 13 to which no pulse signal has been propagated at the stage following the delay circuit 13 in the forward delay array 14 to which a pulse signal has been propagated selects the pulse signal CLK and outputs it to the delay circuit 15 at the subsequent stage, thereby delaying the pulse signal CLK in the backward delay array 16.

FIG. 38 is a timing chart to explain an example of the operation of the clock control circuit in FIG. 1 including the conventional SAD circuit when the clock control circuit starts to operate in the reset state, for example, immediately after the power supply has been turned on or it has returned from the power down mode. Since the control circuit 17 is in the reset state, when the first clock signal CLK is inputted to the control circuit 17, the delay circuit 16 at the last stage in the backward delay array 16 selects the first clock signal CLK and outputs it as Dout (a pulse signal generated without passing through the delay line of FIG. 1).

On the other hand, the first clock signal CLK is inputted as Din to the forward delay array 14 after it has passed through the delay monitor circuit 12. Then, after a time of τ−A has elapsed since the rise of Din corresponding to the first clock signal CLK, the backward delay array 16 starts to delay the next clock signal CLK, delays the next clock signal CKL for a time of τ−A, and outputs the delayed signal as Dout (a pulse signal generated by passing through the delay line of FIG. 1).

Specifically, two pulse signals with different timing are outputted according to the first clock signal. In response to the output, one pulse signal is outputted to an internal clock signal CK' before it is synchronized with the external clock. The resulting signal is inputted as an asynchronous pulse signal to another clock control circuit.

Figure 39:
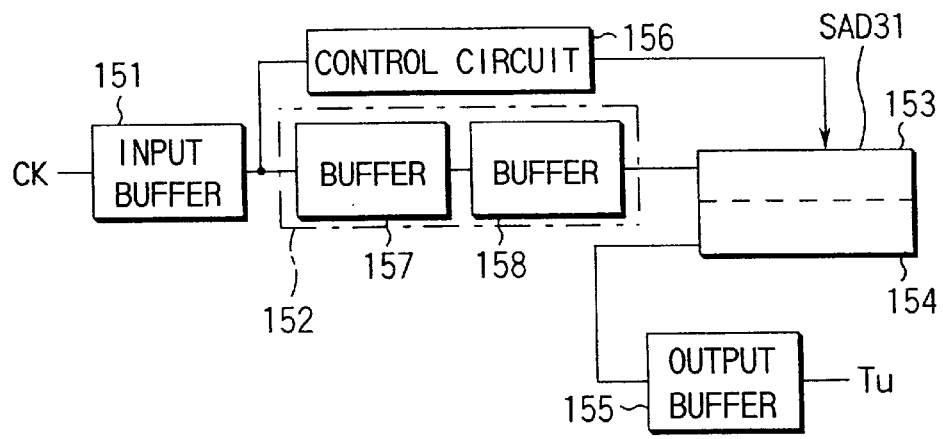
FIG. 39 is a block diagram of a clock signal generator circuit according to a seventh embodiment of the present invention.

FIG. 39 is a block diagram showing a clock control circuit according to a seventh embodiment of the present invention in a case where the clock control circuit is provided with the function of preventing an asynchronous pulse signal from being outputted.

The clock control circuit of the seventh embodiment is composed of an input buffer 151, a delay monitor circuit 152, a SAD circuit 31 including a forward delay array 153 and a backward delay array 154, and an output buffer 155 as is the clock control circuit of FIG. 1. In addition, a control circuit 156 is inserted in the propagation path of clock CLK between the output of the input buffer 151 and the SAD circuit SAD31.

The control circuit 156 has the function of cutting off the first pulse signal in the clock signal CLK outputted from the input buffer 151 and outputting pulse signals after the first pulse signal. For example, the control circuit using a counter of FIG. 32 or 33 or the control circuit using a shift register of FIG. 34 may be used as the control circuit 156.

The delay monitor circuit 152 is composed of a buffer 157 having a configuration equivalent to that of the input buffer 151 and a buffer 158 having a configuration equivalent to that of the output buffer 155 so that it may have the same delay time as the sum of the delay time in the input buffer 151 and that in the output buffer 155.

As described above, since the control circuit 156 for cutting off an asynchronous pulse signal is inserted in the propagation path of the clock signal CLK between the output of the input buffer 151 and the SAD circuit SAD31, the control circuit 156 cuts off the clock signal CLK indicated by C1 in the timing chart of FIG. 38. This prevents the clock signal CLK from being inputted to the SAD circuit SAD31, which prevents an asynchronous pulse signal from being outputted as the internal clock signal CK'.

In the clock control circuit of the seventh embodiment where the control circuit 156 is inserted in the CLK line of the SAD circuit, an error might occur in the output clock signal (CK'), depending on the delay time in the clock signal caused by the control circuit 156.

When the error becomes a problem in the operation of the chip, an output error caused by the insertion of the control circuit 156 in the CLK line can be canceled by providing the delay monitor circuit 152 with a circuit with a signal delay time corresponding to the signal delay time in the control circuit 156.

Figure 40:
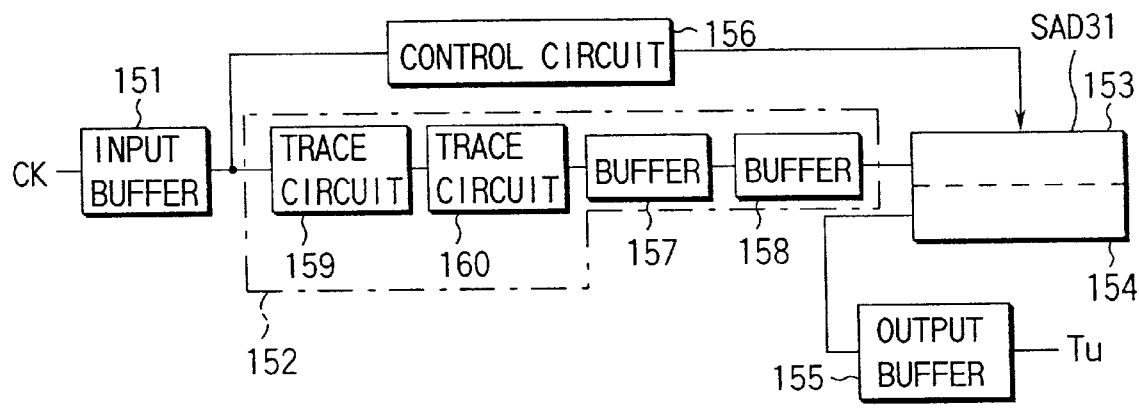
FIG. 40 is a block diagram of a clock signal generator circuit according to an eighth embodiment of the present invention.

FIG. 40 is a block diagram showing the configuration of a clock control circuit according to an eighth embodiment of the present invention which cancels an output error caused by use of the control circuit 156.

With the clock control circuit of the eighth embodiment, two trace circuits 159 and 160 each having a configuration and signal delay time equivalent to those of the control circuit 156 are connected in series with buffers 157 and 158 in the delay monitor circuit 152.

Figure 41:
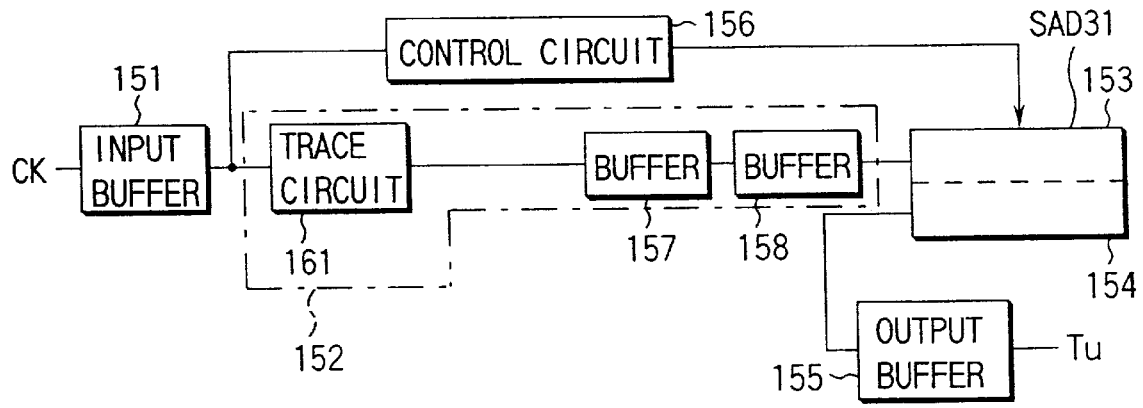
FIG. 41 is a block diagram of a clock signal generator circuit according to a ninth embodiment of the present invention.

FIG. 41 is a block diagram of a clock control circuit according to a ninth embodiment of the present invention. In FIG. 40, two trace circuits 159 and 160 each having a configuration and signal delay time equivalent to those of the control circuit 156 have been provided in the delay monitor circuit 152. Instead, a single trace circuit 161 having twice the signal delay time of the control circuit 156 may be provided as shown in FIG. 41.

Figure 42:
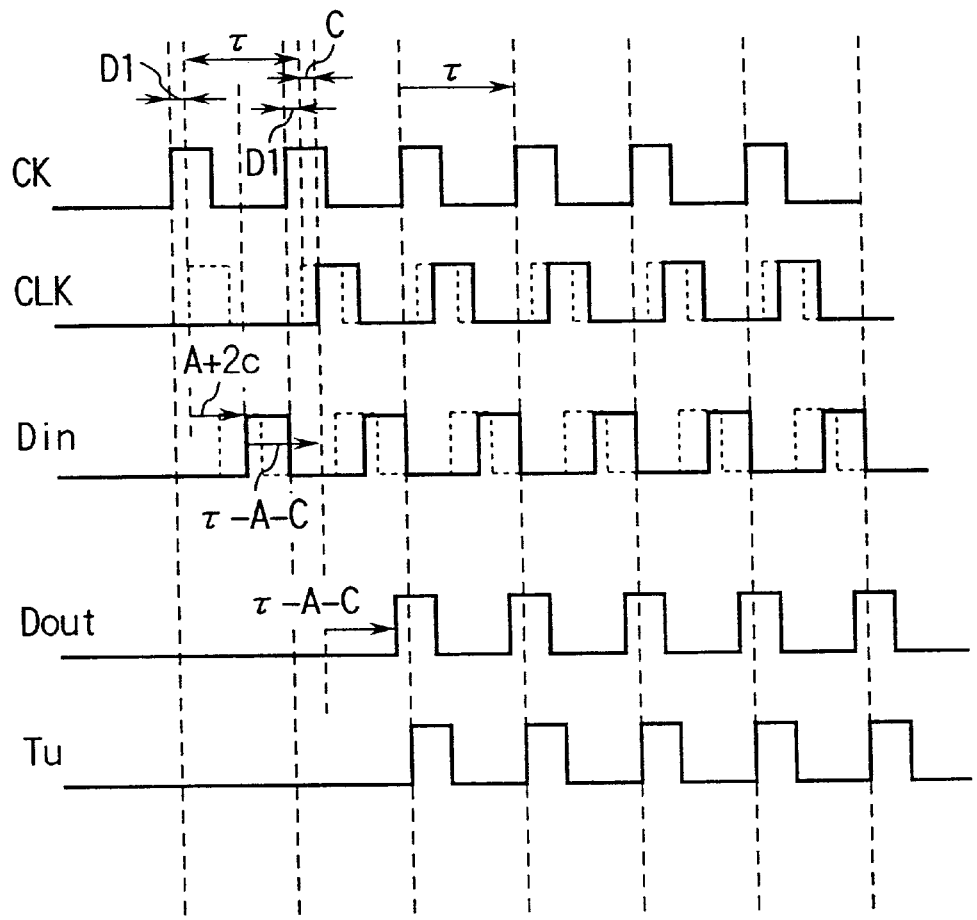
FIG. 42 is a timing chart to help explain an example of the operation of a clock signal generator circuit in FIG. 41.

Next, the operation of the clock control circuits shown in FIGS. 40 and 41 will be explained using the timing chart of FIG. 42. It is assumed that the sum of the delay times of the two trace circuits 159, 160 in FIG. 40 or the signal delay time of the single trace circuit 161 in FIG. 41 is 2c. In addition, the external clock signal CK is assumed to be inputted as an input clock signal.

When the first external clock signal CK has been inputted, the input buffer 151 outputs a clock signal CLK after the delay time D1 of the input buffer 151 has elapsed. The delay monitor circuit 152 delays the clock signal CLK for a time of A+2c and inputs the delayed signal as Din to the SAD circuit SAD31. The signal Din inputted to the SAD circuit SAD31 is then delayed by the forward delay array 153 for τ−A−c. Thereafter, the next clock signal CLK is delayed by the backward delay array 154 for τ−A−c. The delayed signal is outputted from the SAD circuit SAD31 as a signal Dout. The signal Dout is further delayed by the output buffer 155 for the signal delay time D2. The delayed signal is outputted from the output buffer 155 as an internal clock signal Tu.

As described above, with each of the clock control circuits of FIGS. 40 and 41, the effect of the signal delay time in the control circuit 156 is eliminated by providing the trace circuits 159 and 160 in the delay monitor circuit 152, which removes an error in the internal clock signal Tu.

In the clock control circuit according to each of the seventh to ninth embodiments of FIGS. 39 to 41, the internal clock signal Tu synchronizing with the external clock signal has been generated. The clock control circuit may be modified in such a manner that the backward delay array has n/m (where n and m are integers) of the amount of delay in the forward delay array, such as 90° or 180° in phase for the amount of delay in the forward delay array, thereby producing an internal clock signal 360°×n/m out-of-phase with the external clock signal.

Figure 43:
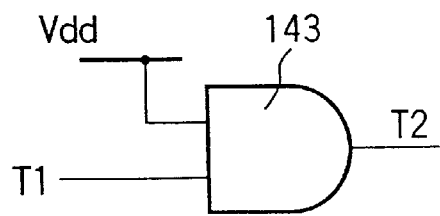
FIG. 43 is a circuit diagram of the control circuit used in the respective clock signal generator circuits in FIGS. 39 to 41.

The series connection of the trace circuits 159, 160 or the single trace circuit 161 has a signal delay time equivalent to that of the control circuit 156. For example, when a control circuit using the shift register of FIG. 34 is used as the control circuit 156, a circuit using only the AND gate 143 in the control circuit of FIG. 43 can be used. The reason is that the signal delay time between clock signals T2 and T1 is determined by the AND gate 143 in the control circuit of FIG. 34. When the AND gate 143 is used as a trace circuit, a power-supply potential Vdd corresponding to the high level is applied constantly to the other inputs except for the clock signal T1.

In the circuit of FIG. 40, the two trace circuits 159, 160 each having a signal delay time equivalent to that of the control circuit 156 have been provided in the delay monitor circuit 152. Three or more trace circuits may be connected in series, as long as they have a total signal delay time equivalent to twice the amount of delay of the control circuit 156.

In the seventh to ninth embodiments, the clock control circuit has been so constructed that the insertion of the control circuit 156 in the CLK line prevents an asynchronous signal from being outputted. A tenth embodiment of the present invention where a backward delay array 16 is designed to prevent an asynchronous clock signal from being outputted will be explained.

FIG. 44 shows a concrete configuration of a delay circuit in the backward delay array for performing logical operation as shown in FIG. 37.

The delay circuit is composed of a clocked inverter 171, a clocked inverter 172, and an inverter 173 to whose input node the output nodes of the clocked inverters 171, 172 are both connected. The clocked inverter 171 receives the output from the preceding stage and operates when a control signal Q is low and its inverted signal bQ is high, thereby inverting the input. The clocked inverter 172 receives the clock signal CLK and operates when a control signal bQ is low and its inverted signal Q is high, thereby inverting the input.

With the delay circuit having such a configuration, even when the control circuit 17 is in the reset state, if the voltage at the CLK goes to the high level, the output goes to the low level as shown in FIG. 37. Specifically, when the control circuit 17 is in the reset state, the control signal bQ goes to the low level and the signal Q goes to the high level, causing the clocked inverter 17 to operate, which makes the output have a level corresponding to the voltage at the CLK line.

Therefore, when the first clock signal CLK has gone high immediately after reset, the delay circuit 15 at the last stage in the backward delay array 16 outputs an asynchronous pulse signal.

To avoid this, the clock control circuit of the tenth embodiment uses a delay circuit performing logical operation as shown in FIG. 45 as the delay circuit 15 at the last stage in the backward delay array 16. Namely, with the delay circuit performing logical operation as shown in FIG. 45, when the control circuit 17 is in the reset state, even if the voltage at the CLK line goes to the high level, the output does not go to the high level but remains at the low level.

FIG. 46 is a block diagram showing the configuration of the delay circuit at the last stage in the backward delay array 16 for performing the logical operation as shown in FIG. 45.

The delay circuit differs from that of FIG. 44 in that, instead of inputting the clock signal CLK, a potential of Vss is applied constantly to the clocked inverter 172, thereby allowing a low-level signal to be inputted.

With this configuration, when the control signal bQ is low and signal Q is high, even if the clocked inverter 172 operates, its output is at the high level, the reverse of the low level of the input. The inverter 173 to which the high-level signal is inputted outputs a low-level signal.

Specifically, when a delay circuit having the configuration of FIG. 46 is used as the delay circuit 15 at the last stage in the backward delay array 16, the delay circuit at the last stage is prevented from selecting and outputting the clock signal CLK. The delay circuit shown in FIG. 44 is used as a delay circuit other than that at the last stage in the backward delay array 16.

As a result, a clock control circuit having such a backward delay array 16 prevents an asynchronous clock signal from being outputted in response to the external clock signal.

When the delay circuit at the last stage in the backward delay array 16 selects the clock signal CLK as the upper limit of the frequency of the external clock signal inputted to a clock control circuit with a SAD circuit, the period of the outputted internal clock signal just increases by a value equivalent to the delay circuit, which causes no problem. For example, when the possible operating frequency is 100 MHz (with a period of 10 ns), if the signal delay time per stage of delay circuit is, for example, 400 ps, one period is 10 ns+400 ns=10.4 ns in the clock control circuit of the tenth embodiment using the delay circuit of FIG. 45 as the backward delay array, which enables the clock control circuit to operate up to 96 MHz. That is, the effect of using such a clock control circuit is as small as 10% or less.

Since the actual operating frequency of the SAD circuit is sufficiently lower than the possible operating frequency, there is no problem at all.

Even when the delay circuit shown in FIG. 46 is used as the delay circuit 15 at the last stage in the backward delay array 16, synchronization can be established accurately, because the signal delay time in allowing the pulse signal from the preceding stage to pass through is identical with that in each of the delay circuits except for the delay circuit at the last stage.

While the delay circuit shown in FIG. 46 has been used as only the delay circuit at the last stage in the backward delay array 16, it is not restricted to the last stage. As long as there is no adverse effect on the operating frequency, more than one delay circuit as shown in FIG. 46 may be used as delay circuits at stages including the last stage, depending on the pattern or other factors.

As described above, with the fourth to tenth embodiments, synchronization is established at high speed in a clock control circuit, stopping the operation of the clock control circuit in the unnecessary period, which prevents the standby power from increasing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock signal generator circuit comprising:

an off-chip driver which has a specific signal delay time from when a control signal is inputted until it outputs data and which outputs data on the basis of the control signal;

a first clock control circuit which receives a first clock signal and outputs a second clock signal synchronizing with the first clock signal and advanced in phase with respect to the first clock signal by at least the signal delay time in the off-chip driver;

a second clock control circuit which receives a third clock signal and outputs a fourth clock signal synchronizing with the third clock signal, advanced in phase with respect to the third clock signal by at least the signal delay time in the off-chip driver, and having the same frequency as the second clock signal, and different in phase from the second signal; and an OR circuit which receives the second clock signal and the fourth clock signal and outputs the control signal for controlling the data output operation of the off-chip driver.

2. The circuit according to claim 1, wherein said first clock control circuit outputs said second clock signal in such a manner that its phase is advanced with respect to the first clock signal by the signal delay time in said off-chip driver plus the signal delay time in said OR circuit, and said second clock control circuit outputs said fourth clock signal in such a manner that its phase is advanced with respect to the third clock signal by the signal delay time in said off-chip driver plus the signal delay time in said OR circuit.

3. The circuit according to claim 1, wherein at least one of said first clock signal inputted to said first clock control circuit and said third clock signal inputted to said second clock control circuit is an internal clock signal outputted from another clock control circuit provided in the chip.

4. The circuit according to claim 1, wherein both of said first clock signal inputted to said first clock control circuit and said third clock signal inputted to said second clock control circuit are external clock signals inputted from outside the chip or clock signals in the chip.

5. The circuit according to claim 1, wherein each of said first and second clock control circuits includes a delay monitor circuit which receives a clock signal and outputs a pulse signal, and a synchronous traced backward delay circuit which has a forward delay array and a backward delay array, receives the clock signal and the output pulse signal from the delay monitor circuit, causes said forward delay array to delay, for a specific time, the output pulse signal from the delay monitor circuit after the input of the clock signal in a first cycle, and causes said backward delay array to delay the clock signal in a second cycle following the first cycle for the time equivalent to the delay time in the pulse signal delayed by said forward delay array or half the delay time, after the clock signal in the second cycle has arrived.

6. The circuit according to claim 5, further comprising a trace circuit having basically the same circuit configuration as that of said off-chip driver and inserted in the middle of a propagation path of said clock signal in said delay monitor circuit.

7. The circuit according to claim 6, wherein said trace circuit includes a first off-chip driver trace circuit which has basically the same circuit configuration as that of said off-chip driver and whose input data is fixed to a low level, a second off-chip driver trace circuit which has basically the same circuit configuration as that of said off-chip driver and whose output and the output of said first off-chip driver trace circuit are connected in common and whose input data is fixed to a high level, and an off-chip driver select control circuit which causes said first off-chip driver trace circuit to selectively operate when said control signal outputted from said OR circuit is at a first logic level and said second off-chip driver trace circuit to selectively operate when said control signal is at a second logic level.

8. The circuit according to claim 7, further comprising a dummy pad which is commonly connected to output nodes of said first and second off-chip driver trace circuit and gives said common output node a parasitic capacity equivalent to that of the pad connected to the output of said off-chip driver.

9. The circuit according to claim 8, wherein said dummy pad has a pattern equivalent to that of said pad connected to the output of said off-chip driver.

10. A clock signal generator circuit comprising:

an off-chip driver which outputs high-level data on the basis of a first control signal, and outputs low-level data on the basis of a second control signal, wherein a signal delay time from when the first control signal is inputted until the high-level data is outputted is different from a signal delay time from when the second control signal is inputted until the low-level data is outputted;

a first control signal generator circuit which generates said first control signal inputted to said off-chip driver and, in response, said off-chip driver outputting high-level data on the basis of said first control signal; and a second control signal generator circuit which generates said second control signal inputted to said off-chip driver and, in response, said off-chip driver outputting low-level data on the basis of said second control signal; and wherein said first control signal generator circuit includes a first clock control circuit which receives a first clock signal and outputs a second clock signal synchronizing with the first-clock signal and, when said off-chip driver outputs high-level data, advanced in phase with respect to the first clock signal by the signal delay time from when said first control signal is inputted to said off-chip driver until the data is outputted, a second clock control circuit which receives a third clock signal and generates a fourth clock signal, said fourth clock signal being synchronous with the third clock signal, having the same frequency as the second clock signal, being different in phase from the second clock signal and advanced in phase with respect to the third clock signal by a signal delay time when the off-chip driver outputs high-level data, said signal delay time being a period that starts when the first control signal is input to the off-chip driver and ends when the data is output from the off-chip driver, and a first OR circuit which receives the second clock signal and the fourth clock signal and outputs a fifth clock signal for controlling the data output operation of said off-chip driver outputting high-level data, and said second control signal generator circuit includes a third clock control circuit which receives a sixth clock signal and outputs a seventh clock signal synchronizing with the sixth clock signal and, when said off-chip driver outputs low-level data, advanced in phase with respect to the sixth clock signal by the signal delay time from when said second control signal is inputted to said off-chip driver until the data is outputted, a fourth clock control circuit which receives an eighth clock signal and generates a ninth clock signal, said ninth clock signal being synchronous with the eighth clock signal, having the same frequency as the seventh clock signal, being different in phase from the seventh clock signal and advanced in phase with respect to the eighth clock signal by a signal delay time when the off-chip driver outputs low-level data, said signal delay time being a period that starts when the second control signal is input to the off-chip driver and ends when the data is output from the off-chip driver, and a second OR circuit which receives the seventh clock signal and the ninth clock signal and outputs a tenth clock signal for controlling the data output operation of said off-chip driver outputting low level data.

11. The circuit according to claim 10, wherein said first and second clock control circuits output said second and fourth clock signals respectively in such a manner that their phase is advanced by the signal delay time in said off-chip driver plus the said third and fourth clock control circuits output said seventh and ninth clock signals respectively in such a manner that their phase is advanced by the signal delay time in said off-chip driver plus the signal delay time in said second OR circuit.

12. The circuit according to claim 10, wherein each of said first to fourth clock control circuits includes a delay monitor circuit which receives a clock signal and outputs a pulse signal, and a synchronous adjusting delay circuit which has a forward delay array and a backward delay array receives the clock signal and the output pulse signal from the delay monitor circuit, causes said forward delay array to delay, for a specific time, the output pulse signal from the delay monitor circuit after the input of the clock signal in a first cycle, and causes said backward delay array to delay the clock signal in a second cycle following the first cycle for the time equivalent to the delay time in the pulse signal delayed by said forward delay array or half the delay time, after the clock signal in the second cycle has arrived.

13. The circuit according to claim 10, further comprising a trace circuit having basically the same circuit configuration as that of said off-chip driver and inserted in the middle of the propagation path of said clock signal in said delay monitor circuit.

14. A clock signal generator circuit comprising:

a first clock control circuit which receives a first clock signal and outputs a second clock signal;

a control circuit which cuts off at least a first pulse of the second clock signals outputted from the first clock control circuit and thereafter sequentially outputs a group of pulse signals outputted from the first clock control circuit; and a second clock control circuit which receives the group of pulse signals outputted from said control circuit and outputs a third clock signal.

15. The circuit according to claim 14, wherein said control circuit includes a counter.

16. The circuit according to claim 14, wherein said control circuit includes a shift register.

17. The circuit according to claim 16, wherein said control circuit includes shift registers connected in a multistage manner, with a count start signal being inputted to the first stage and said first clock signal being inputted as a shift control signal to the respective registers, and a logic circuit to which the output of the last-stage one of the shift registers and said first clock signal are inputted.

18. The circuit according to claim 14, wherein at least one of said first and second clock control circuits includes a delay monitor circuit which receives a clock signal, and a synchronous adjusting delay circuit which has a forward delay array and a backward delay array, receives the clock signal and the output pulse signal from the delay monitor circuit, causes said forward delay array to delay, for a specific time, the clock signal outputted from the delay monitor circuit after the input of the clock signal in a first cycle, and causes said backward delay array to delay the clock signal in a second cycle following the first cycle for the time equivalent to the delay time in the pulse signal delayed by said forward delay array or n/m of the delay time (where n and m are positive integers), after the clock signal in the second cycle has arrived.

19. The circuit according to claim 18, wherein said delay monitor circuit includes a trace circuit of said control circuit which has twice the amount of signal delay in said control circuit.

20. The circuit according to claim 19, wherein said trace circuit includes a first and a second trace circuit each of which has a circuit configuration and circuit pattern equivalent to those of said control circuit.

21. A clock signal generator comprising:

a first clock control circuit which includes a first delay monitor circuit which receives and outputs a clock signal, and a first synchronous adjusting delay circuit which has a first forward delay array and a first backward delay array, said first synchronous adjusting delay circuit receiving a first clock signal and the clock signal outputted from the first delay monitor circuit, causing the first forward delay array to delay, for a specific delay time, the clock signal outputted from the first delay monitor circuit after the input of the first clock signal in a first cycle, said first synchronous adjusting delay circuit causing the first backward delay array to delay the first clock signal in a second cycle following the first cycle for a time equivalent to the delay time in the clock signal delayed by the first forward delay array or n/m of the delay time (where n and m are positive integers), after the first clock signal in the second cycle has arrived, and which outputs a second clock signal;

a control circuit which is inserted between an input node of the first clock signal and the first synchronous adjusting delay circuit of said first clock control circuit and which cuts off at least a first pulse of the first clock signal and thereafter sequentially outputs the first clock signal supplied to the input node; and a second clock control circuit which receives the second clock signal from the first clock control circuit and outputs a third clock signal.

22. The circuit according to claim 21, wherein said second clock control circuit includes a second delay monitor circuit which receives said second clock signal, and a second synchronous adjusting delay circuit which has a second forward delay array and a second backward delay array, receives said second clock signal and the clock signal outputted from the second delay monitor circuit, causes said second forward delay array to delay, for a specific time, the clock signal outputted from the second delay monitor circuit after the input of the second clock signal in the first cycle, and causes the second backward delay array to delay the second clock signal in the second cycle for the time equivalent to the delay time in the clock signal delayed by the second forward delay array or half the delay time, after the second clock signal in the second cycle has arrived.

23. The circuit according to claim 21, wherein said control circuit includes a counter.

24. The circuit according to claim 21, wherein said control circuit includes a shift register.

25. The circuit according to claim 24, wherein said control circuit includes shift registers connected in a multistage manner, with a count start signal being inputted to the first stage and said first clock signal being inputted as a shift control signal to the respective registers, and a logic circuit to which the output of the last-stage one of the shift registers and said second clock signal outputted from said first clock control circuit are inputted.

26. The circuit according to claim 21, wherein said first delay monitor includes a trace circuit of said control circuit which has twice the amount of signal delay in said control circuit.

27. The circuit according to claim 26, wherein said trace circuit includes a first and a second trace circuit each of which has a circuit configuration and circuit pattern equivalent to those of said control circuit.

28. A clock control circuit comprising:

an input buffer which receives a clock signal;

a delay monitor circuit to which the output of the input buffer is inputted and which has a specific amount of signal delay;

a first delay array which is composed of a plurality of first delay circuits cascade-connected in a multistage manner and causes the cascade-connected first delay circuits to delay the output of the delay monitor circuit sequentially;

a sense circuit to which the output of the input buffer is inputted and which senses the first delay circuits through which the output of the delay monitor circuit has passed in the first delay array during one period from when the delay monitor circuit outputs the clock signal in a first cycle until the clock signal in a second clock following the first cycle is outputted;

a second delay array which is composed of a plurality of second delay circuits cascade-connected in a multistage manner and which causes the second delay circuit at the stage corresponding to the result of the sensing at the sense circuit to select the clock signal in the second cycle outputted from the delay monitor circuit, and sequentially delays the selected clock signal through the second delay circuits at the stages following the stage corresponding to the result; and an output buffer to which the output of the second delay array is inputted, wherein said delay monitor circuit has the amount of signal delay equivalent to the sum of the amount of signal delay in said input buffer and that in said output buffer and the second delay circuits, at least the last stage in said second delay array delays only the output of the second delay circuit at the preceding stage without receiving said clock signal outputted from said delay monitor circuit.

29. The circuit according to claim 28, wherein each of said second delay circuits includes a first inverter circuit which receives the output of said second delay circuit at the preceding stage, a second inverter circuit whose output node and the output node of the first inverter circuit are connected in common, and a third inverter circuit whose input is connected to the common output node of the first and second inverter circuits and whose output is inputted to said second delay circuit at the following stage, with a fixed potential being applied to the second inverter circuit of the second delay circuit at least the last stage and said clock signal outputted from said delay monitor circuit being supplied to the second inverter circuits of the second delay circuits excluding the second delay circuit at the last stage.

\* \* \* \* \*